United States Patent
Wiggins et al.

(10) Patent No.: US 9,423,476 B2
(45) Date of Patent: Aug. 23, 2016

(54) APPARATUS, SYSTEMS AND METHODS FOR FACILITATING SIGNAL EXCITATION AND/OR RECEPTION IN A MAGNETIC RESONANCE SYSTEM

(75) Inventors: Graham C. Wiggins, New York, NY (US); Bei Zhang, Harstdale, NY (US); Daniel K. Sodickson, Larchmont, NY (US)

(73) Assignee: New York University, New York, NY (US)

( * ) Notice: Subject to any disclaimer, the term of this patent is extended or adjusted under 35 U.S.C. 154(b) by 727 days.

(21) Appl. No.: 13/446,689

(22) Filed: Apr. 13, 2012

(65) Prior Publication Data

US 2013/0063145 A1 Mar. 14, 2013

Related U.S. Application Data

(60) Provisional application No. 61/475,022, filed on Apr. 13, 2011.

(51) Int. Cl.
*G01R 33/345* (2006.01)
*G01R 33/48* (2006.01)

(52) U.S. Cl.
CPC .......... *G01R 33/345* (2013.01); *G01R 33/4802* (2013.01)

(58) Field of Classification Search
CPC .......................... G01R 33/345; G01R 33/4802
USPC .................................................. 300/300–322
See application file for complete search history.

(56) References Cited

U.S. PATENT DOCUMENTS

| | | | | |
|---|---|---|---|---|
| 5,132,621 A | * | 7/1992 | Kang ............... | G01R 33/34046 324/318 |
| 5,179,332 A | * | 1/1993 | Kang ................. | G01R 33/3607 324/307 |
| 5,243,287 A | * | 9/1993 | Hashoian .......... | G01R 33/3657 324/318 |
| 5,808,467 A | * | 9/1998 | Ochi .................. | G01R 33/3415 324/309 |
| 5,898,306 A | * | 4/1999 | Liu et al. ....................... | 324/322 |
| 5,903,198 A | * | 5/1999 | Weiss ........................ | H01P 1/32 333/24.1 |
| 5,949,311 A | * | 9/1999 | Weiss ....................... | H01P 1/215 333/202 |
| 6,107,974 A | * | 8/2000 | Votruba ................... | H01Q 7/06 324/318 |
| 6,608,480 B1 | * | 8/2003 | Weyers .............. | G01R 33/3415 324/318 |
| 7,145,339 B2 | * | 12/2006 | Saylor .................. | G01R 33/422 324/318 |

(Continued)

OTHER PUBLICATIONS

Wikipedia, "Waveguide (electromagnetism)", Apr. 2, 2011.*

(Continued)

*Primary Examiner* — Dixomara Vargas
(74) *Attorney, Agent, or Firm* — Andrews Kurth LLP

(57) ABSTRACT

In accordance with certain exemplary embodiments of the present disclosure, provided herein are apparatus, systems and methods for, e.g., facilitating signal excitation and/or reception in a magnetic resonance system, such as, e.g., a system configured for magnetic resonance imaging (MRI) and/or spectroscopy. For example, exemplary embodiments of a method for traveling wave imaging in an MRI system can include, e.g., a circular conductive structure lying in a transverse plane within the scanner bore. The exemplary structure can be concentric with the center of the scanner RF shield. The structure can be arranged to have a resonant mode at the MR frequency characterized by a current pattern which can be configured to excite and receive an exemplary waveguide mode. The exemplary current pattern can be further configured to facilitate traveling wave imaging, for example.

28 Claims, 23 Drawing Sheets

(56) References Cited

U.S. PATENT DOCUMENTS

| | | | |
|---|---|---|---|
| 7,656,154 B2* | 2/2010 | Kawabata | G01R 33/0354 324/244.1 |
| 7,800,368 B2* | 9/2010 | Vaughan | G01R 33/583 324/318 |
| 7,852,084 B2* | 12/2010 | Zhai | G01R 33/3415 324/309 |
| 8,035,382 B2* | 10/2011 | DeVries | G01R 33/3403 324/318 |
| 8,193,810 B2* | 6/2012 | Otake | G01R 33/34046 324/307 |
| 8,754,644 B2* | 6/2014 | Trakic | G01R 33/422 324/307 |
| 8,760,160 B2* | 6/2014 | Tropp | G01R 33/345 324/307 |
| 8,779,772 B2* | 7/2014 | Froehlich | G01R 33/4802 324/318 |
| 2013/0241549 A1* | 9/2013 | Kiruluta | G01R 33/4802 324/309 |

OTHER PUBLICATIONS

Brunner et al., "Travekkubg-wave Nuclear Magnetic Resonance,", Nature, vol. 457, pp. 994-999 (2009).

* cited by examiner

APPARATUS, SYSTEMS AND METHODS FOR FACILITATING SIGNAL EXCITATION AND/OR RECEPTION IN A MAGNETIC RESONANCE SYSTEM

CROSS-REFERENCE TO RELATED APPLICATION(S)

This application relates to and claims priority from U.S. Patent Application Ser. No. 61/475,022, filed on Apr. 13, 2011, the entire disclosure of which is hereby incorporated herein by reference.

STATEMENT REGARDING FEDERALLY SPONSORED RESEARCH

The present disclosure was developed, at least in part, using Government support under NIH Grant No. R01-EB002568 awarded by the National Institutes of Health. Therefore, the Federal Government may have certain rights in the invention.

FIELD OF THE DISCLOSURE

Exemplary embodiments of the present disclosure relate generally to exemplary embodiments of apparatus, systems and methods for, e.g., facilitating signal excitation and reception in a magnetic resonance system, and more particularly to exemplary embodiments of apparatus, systems and methods for signal transmission and/or reception in an magnetic resonance imaging (MRI) system.

BACKGROUND INFORMATION

The dimensions of the RF shield and the RF frequency for proton imaging at 7 T allow the excitation of a propagating TE11 waveguide mode, which has given rise to the concept of traveling wave imaging (see, e.g., Brunner et al., Nature, 457, 994-999 (2009)). RF excitation is typically achieved by using a patch antenna or crossed dipole antenna placed at one end of the bore. A nearly uniform B1+ field is produced along the entire length of the bore when it is empty. With a human body in the bore, dielectric boundaries and tissue conductivity can give rise to standing wave behavior and attenuation of the B1+ field, resulting in a highly non-uniform excitation. The strongest B1+ field and maximum SAR occur in the parts of the body closest to the antenna such as the head and shoulders or legs, with very little excitation in the torso. To create a useful excitation in the torso, it may be necessary to deposit large amounts of energy in the head or legs. Some methods have been described for creating structures which guide the traveling wave to deliver the power more efficiently to more distant regions. It would be desirable though to excite the TE11 traveling wave mode at or near the mid section of the bore, close to the imaging volume of the scanner.

Thus, it may be beneficial to address and/or overcome at least some of the deficiencies described herein above.

SUMMARY OF EXEMPLARY EMBODIMENTS OF THE DISCLOSURE

Indeed, one of the objects of certain exemplary embodiments of the present disclosure can be to address the exemplary problems described herein above, and/or to overcome the exemplary deficiencies commonly associated with the prior art as, e.g., described herein.

Exemplary embodiments of the present disclosure include systems, methods and computer-accessible mediums for facilitating signal excitation and reception in a magnetic resonance system, including arranging a circular conductive structure lying in a transverse plane within a scanner bore, wherein the circular structure can be concentric with a center of a scanner radio frequency (RF) shield; and arranging the circular structure so as to have a resonant mode at a magnetic resonance (MR) frequency characterized by a current pattern, the current pattern being configured for exciting and receiving a waveguide mode. In certain exemplary embodiments the current pattern can be further configured to facilitate a traveling wave imaging capability. Certain exemplary embodiments can further include positioning the structure to be located less than 5 cm from the RF shield. In certain exemplary embodiments the structure can have a diameter sized and can be configured for facilitating at least a part of a human subject to pass through the circular structure. In certain exemplary embodiments the structure can be configured to facilitate a generation of an RF magnetic field within at most about 10 cm from the shield that can be at least partially oriented approximately along a Z-axis relative to a direction of the bore, and enhance a coupling to a particular waveguide mode. In certain exemplary embodiments the particular waveguide mode can be a TE11 waveguide mode. Certain exemplary embodiments can further include positioning the structure at a point along a length of the scanner RF shield so as to generate a local excitation of the waveguide mode upon an excitation thereof. In certain exemplary embodiments the point is a midpoint of a length of the bore. Certain exemplary embodiments can further include positioning at least one further structure at various points along the length of the bore, and facilitating particular phase relationships between the circular structure and the at least one further structure so as to facilitate a control over the RF excitation pattern within the bore.

Another exemplary embodiment can include systems, methods and computer-accessible mediums for facilitating signal excitation and reception in a magnetic resonance system, including: a circular conductive structure lying in an axial plane and concentric with a scanner radio frequency (RF) shield, wherein the circular conductive structure can include a conductive material in at least one of a wire, a tube, a flat tape, or a ribbon shape; and a scanner RF shield, wherein the circular conductive structure is located at least at or near the scanner RF shield, and wherein the circular conductive structure is a cylindrical ribbon with a constant gap between it and the scanner RF shield. In certain exemplary embodiments a width of the ribbon and a size of the gap can be selected to cause the circular conductive structure to facilitate a resonant mode at the MR frequency characterized by a current pattern configured to excite and receive a waveguide mode for facilitating a traveling wave imaging procedure.

Another exemplary embodiment can include systems, methods and computer-accessible mediums for facilitating signal excitation and reception in a magnetic resonance system, including: arranging a plurality of loops lying in a transverse plane to facilitate an RF magnetic field created by each loop being oriented primarily along a bore in a Z-direction, wherein the loops are located at least at or near a scanner radio frequency (RF) shield; and further arranging the plurality of loops so as to facilitate a phase of a current in each loop to vary based on an azimuthal angle relative to a center of a bore of the MRI system so as to facilitate a circularly polarized waveguide mode being created. In certain exemplary embodiments the circularly polarized waveguide mode is a TE11 waveguide mode configured to propagate down the bore.

Another exemplary embodiment can be directed to systems, methods and computer-accessible mediums for facilitating signal excitation and reception in a magnetic resonance system, including arranging a plurality of loop pairs, wherein each loop pair comprises orthogonal loops, wherein one loop of each loop pair lies in a transverse plane and is configured to create an RF magnetic field oriented primarily along a Z direction, and the other loop of each loop pair is configured to create an RF magnetic field oriented primarily towards a center of a scanner bore; and arranging the plurality of loop pairs to be positioned around a periphery of a radio frequency (RF) shield within a common transverse plane, wherein each of the loops which create an RF magnetic field oriented primarily along the Z direction are driven so as to facilitate a phase of a current in each driven loop to vary based on the azimuthal angle relative to the center of the scanner bore.

Another exemplary embodiment can be directed to systems, methods and computer-accessible mediums for facilitating signal excitation and reception in a magnetic resonance system, comprising: arranging two concentric circular conductors to both be concentric with a scanner radio frequency (RF) shield and lying in the same transverse plane as one another; arranging a plurality of radial conductors to connect the two concentric circular conductors with one another, wherein the conductors in an inner circle and in an outer circle are broken by capacitors at at least one point along a circumference of the concentric circular conductors between each radial conductor, wherein the number of radial conductors is an even number; and arranging the structure to have a plurality of resonant modes, wherein at least one of the resonant modes of the structure has a current pattern configured to excite and receive a waveguide mode of a scanner bore.

In certain exemplary embodiments, the at least one resonant mode can be configured to excite and receive the waveguide mode of the scanner bore is configured to be tuned by an adjustment of the capacitors so as to facilitate a match to a MR frequency of the scanner. In certain exemplary embodiments the structure can include an intersecting structure which is cylindrical in shape, which cylindrical structure comprises two circular conductors of approximate equal diameter which are arranged to be concentric with the scanner RF shield and connected by a plurality of further conductors equal in number to the number of radial conductors. In certain exemplary embodiments, two circular conductors can be broken and bridged with capacitors at least one point between each further conductor so as to facilitate the formulation of a high pass birdcage. Certain exemplary embodiments can further include at least one of displaying or storing at least one of (i) information associated with the MRI system, or (ii) information associated with an image generated by the MRI system in a storage arrangement in at least one of a user-accessible format or a user-readable format.

These and other objects, features and advantages of the present disclosure will become apparent upon reading the following detailed description of exemplary embodiments of the present disclosure, when taken in conjunction with the accompanying exemplary drawings and appended claims.

BRIEF DESCRIPTION OF THE DRAWINGS

The foregoing and other objects of the present disclosure will be apparent upon consideration of the following detailed description, taken in conjunction with the accompanying exemplary drawings and claims showing illustrative embodiments of the invention, in which:

FIGS. 4A-4D are illustrations of an Annular Ladder Resonator arrangements and elements, in accordance with certain exemplary embodiments of the present disclosure;

Figure 1:
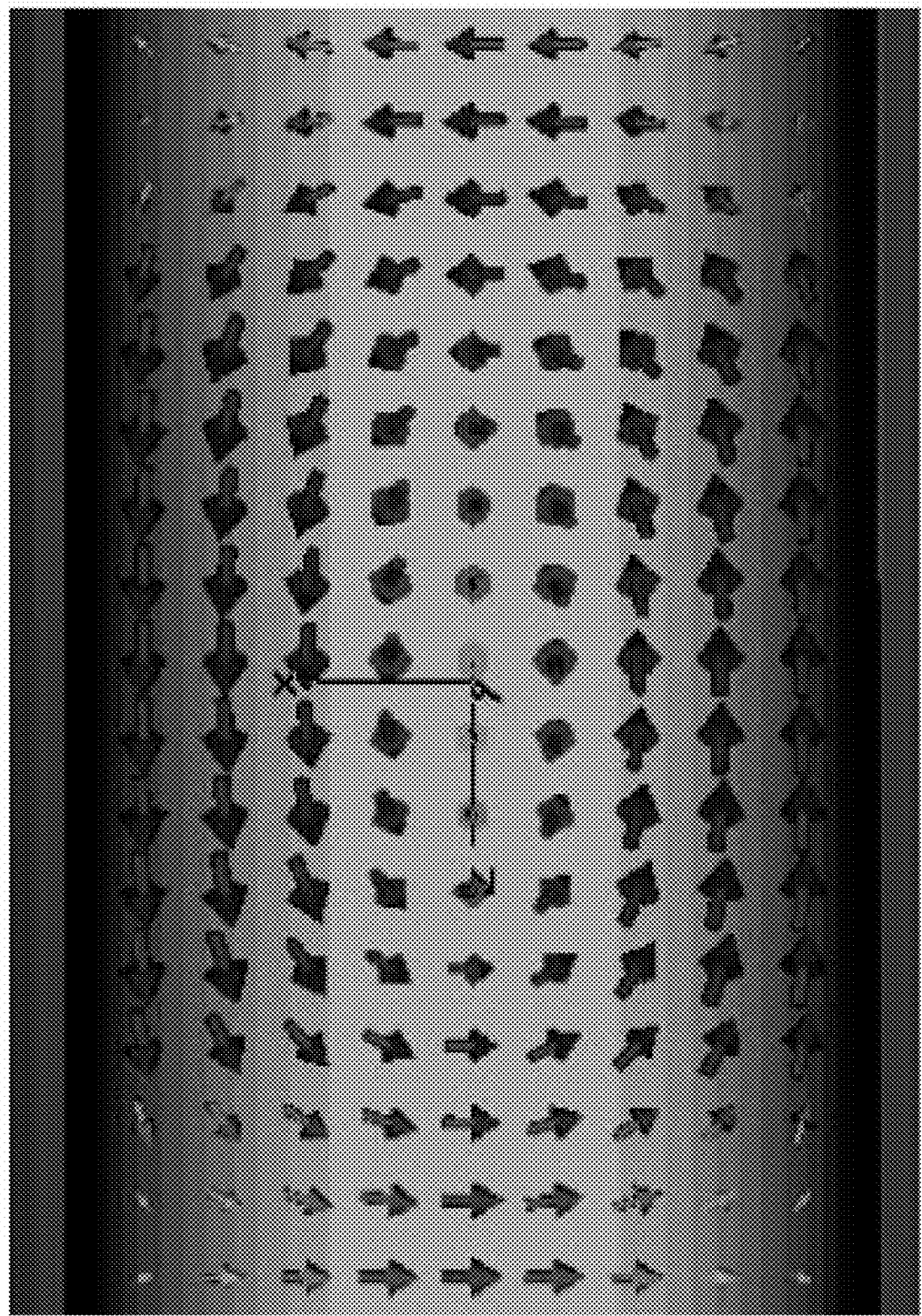
FIG. 1 is an illustration of B-field of typical TE11 waveguide mode, showing B-vectors (H-vectors) oriented primarily along Z at the edges of the bore, in accordance with certain exemplary embodiments of the present disclosure.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative embodiments and apended claims. It is intended that changes and modifications can be made to the described embodiments without departing from the true scope and spirit of the subject disclosure.

DETAILED DESCRIPTION OF EXEMPLARY EMBODIMENTS OF THE DISCLOSURE

Indeed, according to one exemplary embodiment of the present disclosure, a resonator can be provided which can include the annular ladder resonator (ALR), which is tailored to couple to the $TE_{11}$ mode and which can be mounted behind the covers of the 7 T scanner in the space normally occupied by the body coil in a conventional scanner.

For example, exemplary embodiments of system, apparatus and method for facilitating signal excitation and/or reception in a magnetic resonance system, such as, e.g., a system configured for magnetic resonance imaging (MRI) and/or spectroscopy. Traveling wave imaging in the MRI system can also be employed with, e.g., a circular conductive structure lying in a transverse plane within the scanner bore. The exemplary structure can be concentric with the center of the scanner RF shield. The structure can be arranged to have a resonant mode at the MR frequency characterized by a current pattern which can be configured to excite and receive an exemplary waveguide mode so as to facilitate signal transmission and/or reception and/or to facilitate traveling wave imaging capability. Additionally, the exemplary structure can be located near the exemplary RF shield. The exemplary structure can have a sufficiently large diameter to allow a human subject or part of a human subject to pass through it. The exemplary structure can create an RF magnetic field near the shield which can be oriented primarily along the Z direction where Z corresponds to the direction of the main static magnetic field to enhance coupling to the TE11 waveguide mode, for example. The exemplary structure can be placed at essentially any point along the length of the scanner RF shield including the midpoint of the bore to create local excitation of the waveguide mode. Multiple similar structures can be located at various and/or certain points along the bore and driven with particular phase relationships which can allow control over the RF excitation pattern within the bore, for example.

According to another exemplary embodiment of the present disclosure, an exemplary MRI coil can be provided for facilitating traveling wave imaging that can include a circular conductive structure lying in an axial plane and concentric with the scanner RF shield. The exemplary structure can be and/or include conductive material in a wire, tube, flat tape or ribbon shape, for example. The exemplary structure can be located near the exemplary scanner RF shield. The exemplary structure can be a cylindrical ribbon with a constant gap between it and the scanner RF shield, e.g., as illustrated in FIG. 13(b). The width of the ribbon and the size of the gap (e.g., 0 cm>gap size≥5 cm; preferably 1 cm≥gap size≥3 cm, such as about 1.5 cm) can be configured to cause the exemplary structure to have a resonant mode at the MR frequency which can be characterized by a current pattern which can excite and receive a waveguide mode for traveling wave imaging. The space between the ribbon and the RF shield can be filled with air or other dielectric material such as Teflon to control the resonant frequency and provide a substrate on which to mount the ribbon, for example. The exemplary RF power can be coupled into or out of the structure for excitation or reception. The exemplary RF power can be coupled into or out of the exemplary structure via a coaxial cable with the coax shield connected to the scanner RF shield and the coax center conductor connected to the conductive ribbon, with appropriate matching circuitry if warranted.

According to certain exemplary embodiments of the present disclosure, the exemplary resonant mode of the exemplary structure can be suitable for coupling to the TE11 waveguide mode of the scanner bore. The exemplary coaxial cables can be connected to the exemplary structure at, e.g., two points that can be about 90 degrees apart to allow quadrature excitation and reception, for example. Additionally, the exemplary structure can be located behind the covers of the scanner bore in the space between the gradient RF shield and the scanner bore tube. Further, the exemplary structure can be placed at any point along the length of the scanner RF shield, including the midpoint of the bore, to create local excitation of the waveguide mode, for example. Multiple similar structures can be located at various points along the bore and driven with particular phase relationships which can allow control over the exemplary RF excitation pattern within the bore.

In accordance with certain exemplary embodiments of the present disclosure, an exemplary method and/or procedure for facilitating imaging in a MRI system is provided which can include, e.g., arranging a circular conductive structure lying in a transverse plane within a scanner bore, where the circular structure is concentric with a center of a scanner RF shield, and arranging the circular structure so as to have a resonant mode at a MR frequency characterized by a current pattern, the current pattern being configured for exciting and receiving a waveguide mode so as to facilitate a traveling wave imaging capability. The exemplary procedure can further include positioning the structure to be located less than 5 cm from the RF shield, and the structure can have a diameter sized and configured for facilitating at least a part of a human subject to pass through the circular structure. Further, the structure can be configured to facilitate a generation of an RF magnetic field within at most about 10 cm from the shield that is at least partially oriented approximately along a Z-axis relative to a direction of the bore, and enhance a coupling to a particular waveguide mode, such as a TE11 waveguide mode.

The exemplary procedure can further include positioning the structure at a point along a length of the scanner RF shield so as to generate a local excitation of the waveguide mode upon an excitation thereof. For example, the point can be a midpoint of a length of the bore. In accordance with certain exemplary embodiments of the present disclosure, the exemplary procedure can further include positioning at least one further structure at various points along the length of the bore, and facilitating particular phase relationships between the circular structure and the at least one further structure so as to facilitate a control over the RF excitation pattern within the bore.

Exemplary Capacitively Tuned Loop Located Near the RF Shield

According to still another exemplary embodiment of the present disclosure, a MRI coil for traveling wave imaging can be provided which can comprising a circular conductive structure lying in an axial plane and concentric with the scanner RF shield. The exemplary structure can include of conductive material in a wire, tube, flat tape or ribbon shape. The exemplary structure is located near the scanner RF shield The exemplary structure incorporates one or more capacitors in series with the conductor to control the resonant frequency of the desired mode of the structure. Exemplary RF power can be coupled into or out of the structure for excitation or reception. The exemplary RF power can be coupled into or out of the structure via a coaxial cable with the coax shield connected to the scanner RF shield and the coax center conductor connected to the conductive ribbon, with appropriate matching circuitry if required. The exemplary RF power can be coupled into or out of the structure via coaxial cable with the coax shield connected to one side of a particular capacitor in the structure and the coax center conductor connected to the other side of said capacitor with appropriate matching circuitry if required.

The exemplary resonant mode of the structure can be suitable for coupling to the TE11 waveguide mode of the scanner bore. The exemplary coaxial cables can be connected to the structure at two points 90 degrees apart to allow quadrature excitation and reception. The exemplary structure can be located behind the covers of the scanner bore in the space between the gradient RF shield and the scanner bore tube. The exemplary structure can be placed at any point along the length of the scanner RF shield including the midpoint of the bore to create local excitation of the waveguide mode. The exemplary multiple similar structures can be located at various points along the bore and driven with particular phase relationships which allow control over the RF excitation pattern within the bore.

Exemplary Z-Directed Transmit/Receive Array

Further provided herein is an exemplary embodiment of the system, apparatus and method for facilitating the traveling wave imaging in an MRI system. Such exemplary embodiment can utilize a plurality of loops lying in a transverse plane such that the RF magnetic field created by each loop is oriented primarily along the bore in the Z-direction. The exemplary loops can be located near the scanner RF shield. The exemplary phase of the current in each loop varies with the azimuthal angle relative to the center of the bore of the exemplary MRI system such that a circularly polarized TE11 waveguide mode is created which propagates down the bore The exemplary circularly polarized RF field which is created has the correct sense to couple to the spins in the sample and create an MR image. The exemplary structure can be located behind the covers of the scanner bore in the space between the gradient RF shield and the scanner bore tube. The exemplary structure can be placed at any point along the length of the scanner RF shield including the midpoint of the bore to create local excitation of the waveguide mode. The exemplary multiple similar structures can be located at various points along the bore and driven with particular phase relationships which allow control over the RF excitation pattern within the bore.

Exemplary Orthogonal Loop Array for Beam Steering

According to still another exemplary embodiment of the present disclosure, the system, apparatus and method can be provided for facilitating the imaging in an MRI system. Such exemplary embodiment can utilize a plurality of loop pairs each consisting of orthogonal loops where one loop lies in a transverse plane and creates an RF magnetic field oriented primarily along Z and the other loop creates an RF magnetic field oriented primarily towards the center of the scanner bore. The exemplary a plurality of such loop pairs is located around the periphery of the RF shield within a common transverse plane. The exemplary set of loops which each create an RF magnetic field oriented primarily along Z can be driven such that the phase of the current in each loop varies with the azimuthal angle relative to the center of the bore. The exemplary set of loops which each create an RF magnetic field oriented primarily towards the center of the bore can be driven such that the phase of the current in each loop varies with the azimuthal angle relative to the center of the bore. The exemplary relative phase offset between the set of Z-directed loops and the set of center-directed loops can be controlled. The exemplary excitation created in the bore can be steered by controlling the relative phase of the two sets of loops. The exemplary power delivered by the coil system can be directed primarily in the +Z or in the −Z direction. The exemplary coil system can be located behind the covers of the scanner bore in the space between the gradient RF shield and the scanner bore tube. The exemplary coil system can be placed at any point along the length of the scanner RF shield including the midpoint of the bore to create local excitation of the waveguide mode. The exemplary multiple similar coil systems can be located at various points along the bore and driven with particular phase relationships which allow control over the RF excitation pattern within the bore.

Exemplary Annular Ladder Resonator

According to still another exemplary embodiment of the present disclosure, the system, apparatus and method can be provided for facilitating the traveling wave imaging in the MRI system. Such exemplary embodiment can utilize two concentric circular conductors, both concentric with the scanner RF shield and lying in the same transverse plane, connected by a plurality of radial conductors. The exemplary conductors in the inner and outer circles can be broken by capacitors at least one point between each radial conductor. The exemplary number of radial conductors is an even number The exemplary structure has a number of resonant modes. The exemplary one of the resonant modes of the structure has the correct current pattern to excite and receive a waveguide mode of the scanner bore. The exemplary resonant mode which has the correct structure to excite and receive a waveguide mode of the scanner bore is tuned by adjustment of the capacitors to match the MR frequency of the scanner. The exemplary structure is located near the scanner RF shield The exemplary waveguide mode which is excited is the TE11 mode. The exemplary coaxial cables can be connected to the structure at two points 90 degrees apart to allow quadrature excitation and reception. The exemplary structure can be located behind the covers of the scanner bore in the space between the gradient RF shield and the scanner bore tube. The exemplary structure can be placed at any point along the length of the scanner RF shield including the midpoint of the bore to create local excitation of the waveguide mode. The exemplary multiple similar structures can be located at various points along the bore and driven with particular phase relationships which allow control over the RF excitation pattern within the bore.

Exemplary Orthogonal Annular Ladder Resonator and Intersecting Birdcage

Additionally, according to yet another exemplary embodiment of the present disclosure, the system, apparatus and method can be provided for facilitating the imaging in the MRI system. FIG. 1A illustrates such an exemplary embodiment. For example, according to this exemplary embodiment, it is possible to utilize the exemplary structure described herein above, which can have an additional intersecting structure which is cylindrical. The exemplary cylindrical structure comprise two circular conductors of equal diameter concentric with the scanner RF shield. The exemplary two circular conductors can be joined by short conductors equal in number to the radial conductors in the exemplary structure described herein above. The exemplary two circular conductors can be broken and bridged with capacitors at least one point between each linking conductor to form a high pass birdcage. The exemplary structure and the intersecting birdcage structure can be isolated from each other due to the orthogonally of the fields they produce thereby achieving beam steering with 4 or more RF inputs, with an input to control the difference in phase between the structure of section 6 and the intersecting birdcage structure.

Further, according to certain exemplary embodiments of the present disclosure, the phase offset relative to the other loop in the pair forces the traveling wave to propagate primarily in one direction or the other and eliminate the null through the plane of the coil. The exemplary rotation of the B− vector can be controlled when an excitation is created between the structures. Further, in one exemplary embodiment of the present disclosure, it is possible to utilize more than one encircling structure so as to suppress the escape of energy from the bore of the exemplary MRI system.

Whereas the RF shield in the MR scanner is a cylinder and can act as a cylindrical waveguide, there can be various exemplary waveguide modes which can propagate along the waveguide. Each mode has a cutoff frequency such that for frequencies below that cutoff frequency that mode can not propagate down the bore. The various modes of a cylindrical waveguide can be characterized by the nomenclature TEmn and TMmn, where the TE modes have electric fields which can be entirely transverse and the TM modes have magnetic fields which can be entirely transverse. The mode with the lowest cutoff frequency is the TE11 mode. In a 7 Tesla whole-body MR scanner such as that produced by Siemens (Erlangen, Germany) the gradient RF shield has a diameter of 680 mm, allowing propagation of only the TE11 mode, whereas the magnet cryostat has an inner diameter of 900 mm and also acts as a waveguide which allows propagation of both the TE11 and TM01 waveguide modes.

At higher magnetic field and hence higher MR frequency and/or for larger bore sizes, more waveguide modes can be utilized and/or provided to propagate down the bore. These higher order waveguide modes have more complicated magnetic field patterns and require more complicated current patterns in an encircling antenna in order to generate and receive them. The higher order modes of the encircling antenna structure can enable generation and reception of these higher order waveguide modes where they may be facilitated, and an array of transverse elements or composite orthogonal elements could be driven with an appropriate phase relationship to generate and/or receive these higher order waveguide modes, for example.

Further, according to certain exemplary embodiments of the present disclosure, the transmit array structure can be located close to the center of the bore and efficient exemplary coupling to waveguide modes (e.g., TE11 waveguide mode) can be achieved by using a third exemplary orthogonal element. Such exemplary embodiments using 3-axis orthogonal loops can be beneficial since the magnetic field vectors can begin to twist into the transverse plane towards the center of the bore, for example.

Exemplary Methods

For example, exemplary Finite-difference time-domain (FDTD) simulations in accordance with certain exemplary embodiments of the present disclosure can be performed using, e.g., Microwave Studio (CST, Darmstadt, Germany), for example. The exemplary TE11 propagating waveguide mode can be provided by the exemplary patch antenna and include a series of "cells" which can propagate down the bore.

FIG. 1, shows a exemplary vector plot of an exemplary B-field (H-field) of the traveling wave which shows a typical exemplary TE11 cell. For example, it is possible that the exemplary B-field (H-field) can be transverse or only transverse near the center of the bore, and curl into the +/−Z direction near the RF shield. It can also be possible to couple to the Z-directed B-field by placing a loop near the shield lying in an axial plane such that its normal points are primarily along Z (e.g., the orientation which is normally avoided in RF coil design). In certain exemplary embodiments of an ALR coil according to present disclosure, it is possible to line the bore with exemplary loops and join them together to create a resonant structure, for example.

Figure 2A:
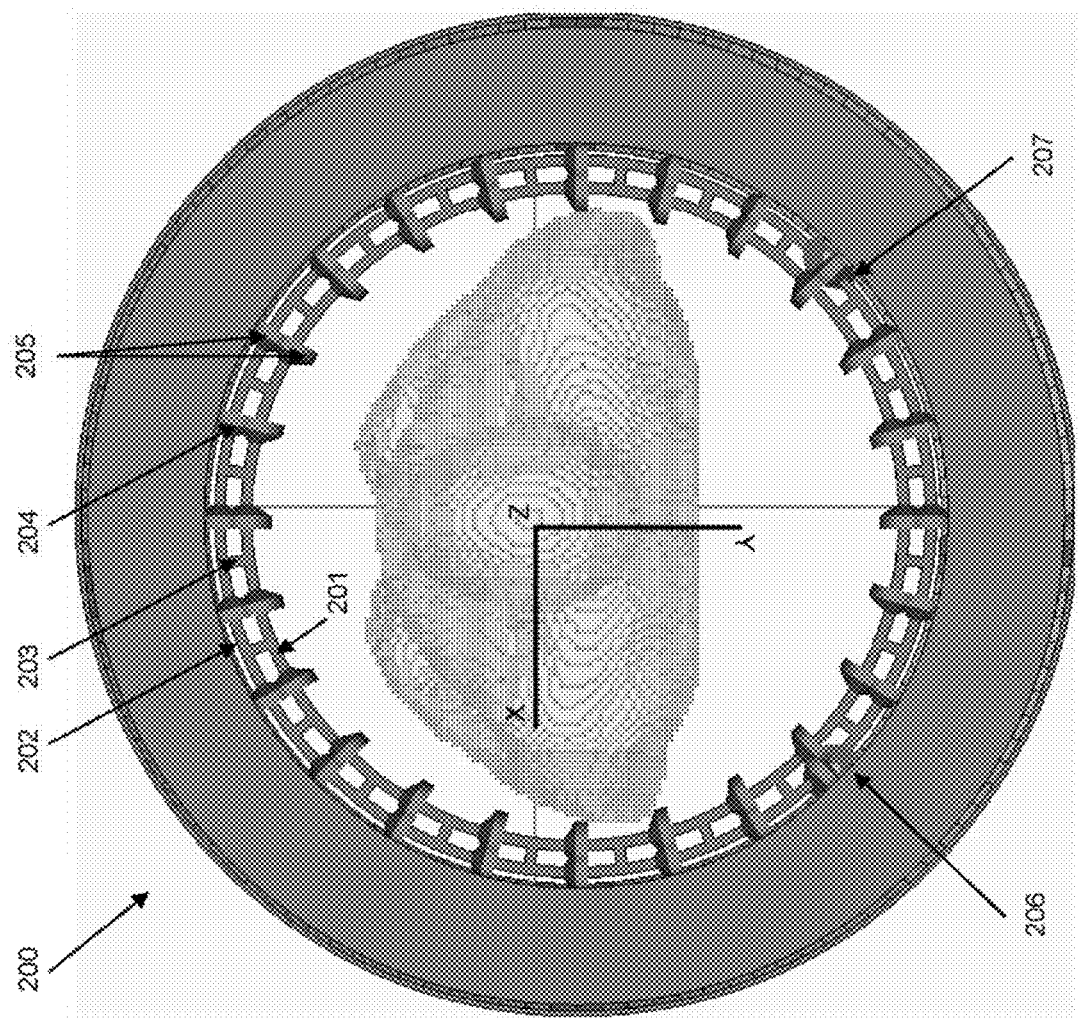
FIG. 2A is an illustration of an Annular Ladder Resonator, in accordance with certain exemplary embodiments of the present disclosure.
Figure 2B:
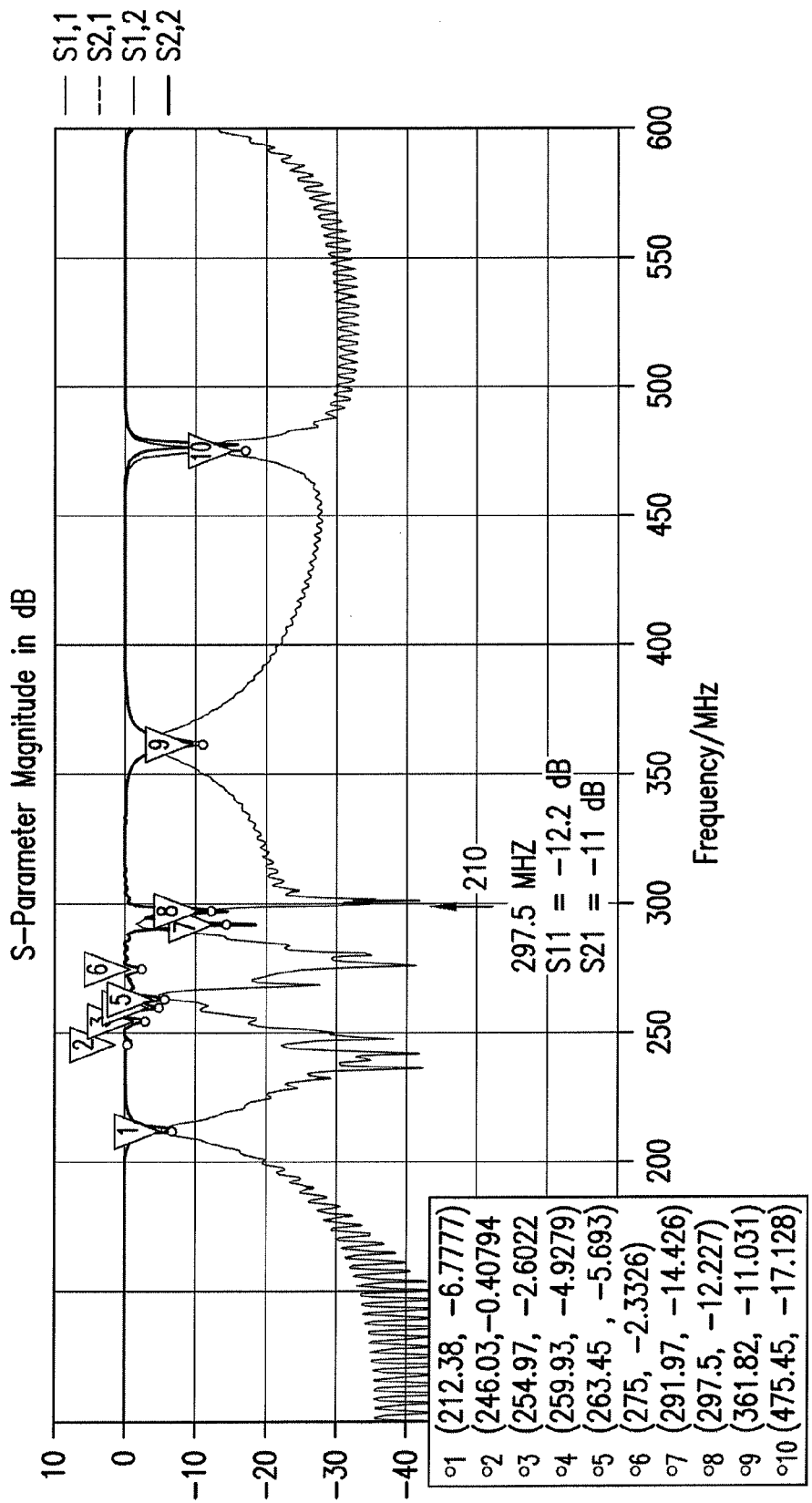
FIG. 2B is an illustration of exemplary S-parameters of an ALR simulation, in accordance with certain exemplary embodiments of the present disclosure.

FIG. 2A shows that an exemplary simulated ALR coil 200 that can consist of, comprise and/or include two relatively large rings 201, 202 having an inner diameter of about 60 cm and about 66 cm, respectively. With 24 radial rungs 203 joining the two rings 201, 202 and 0.8 cm wide conductors 204. This exemplary arrangement can have an exemplary axial loop structure configured to, e.g., create efficient TE11 excitation as described herein above. Exemplary capacitors 205 can be placed in both of the large rings 201, 202 between each of the rungs 203. Exemplary capacitor values can be determined to bring the frequency of the appropriate resonant mode to approximately 297.2 MHz. For example, the exemplary resonant model can be driven with 2 Ports 206, 207 with an approximately 90° phase offset for quadrature excitation. FIG. 2B shows exemplary S parameters of an ALR simulation. A number of different resonant modes are observed in the exemplary simulation, at least one of which can have the current pattern to couple to the $TE_{11}$ waveguide mode (e.g., 210).

Figure 3A:
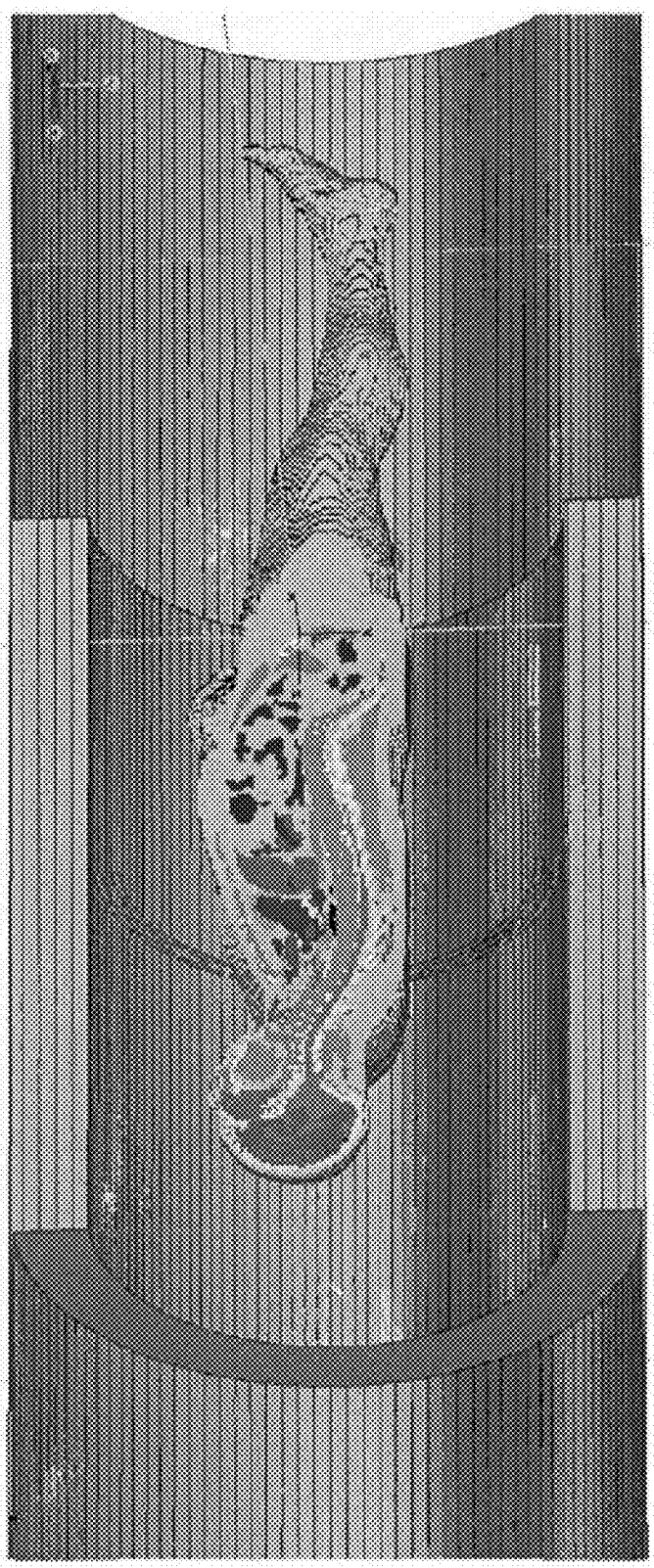
FIGS. 3A and 3B are illustrations of an Annular Ladder Resonator simulation, in accordance with certain exemplary embodiments of the present disclosure.
Figure 3B:
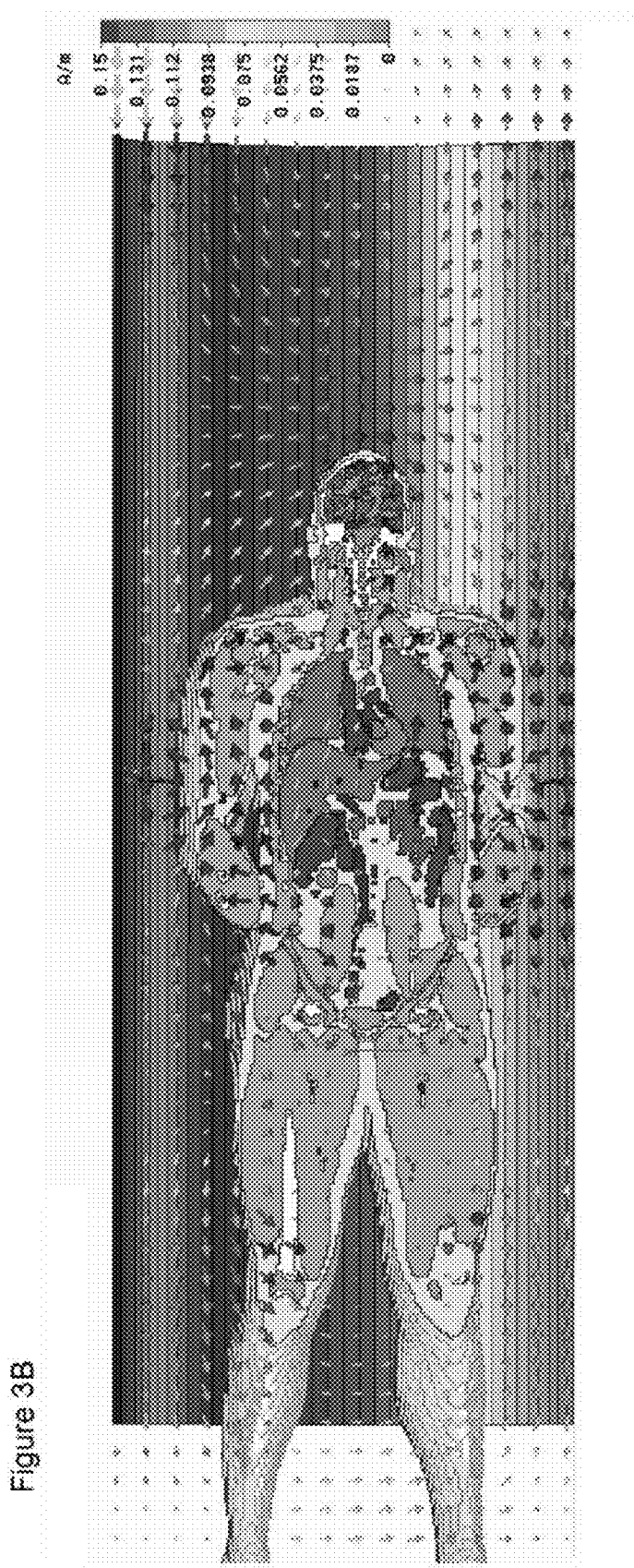

FIG. 3A illustrates a side view of an exemplary Annular Ladder Resonator simulation, shown with the near half cut-away. FIG. 3B shows a top-down view of exemplary B-vectors in an ALR simulation. The exemplary $TE_{11}$ waveguide mode is shown excited, and the exemplary illustrated waves propagate outwards from the center, while the B vector display can be saturated to enhance clarity of structure.

Figure 4A:
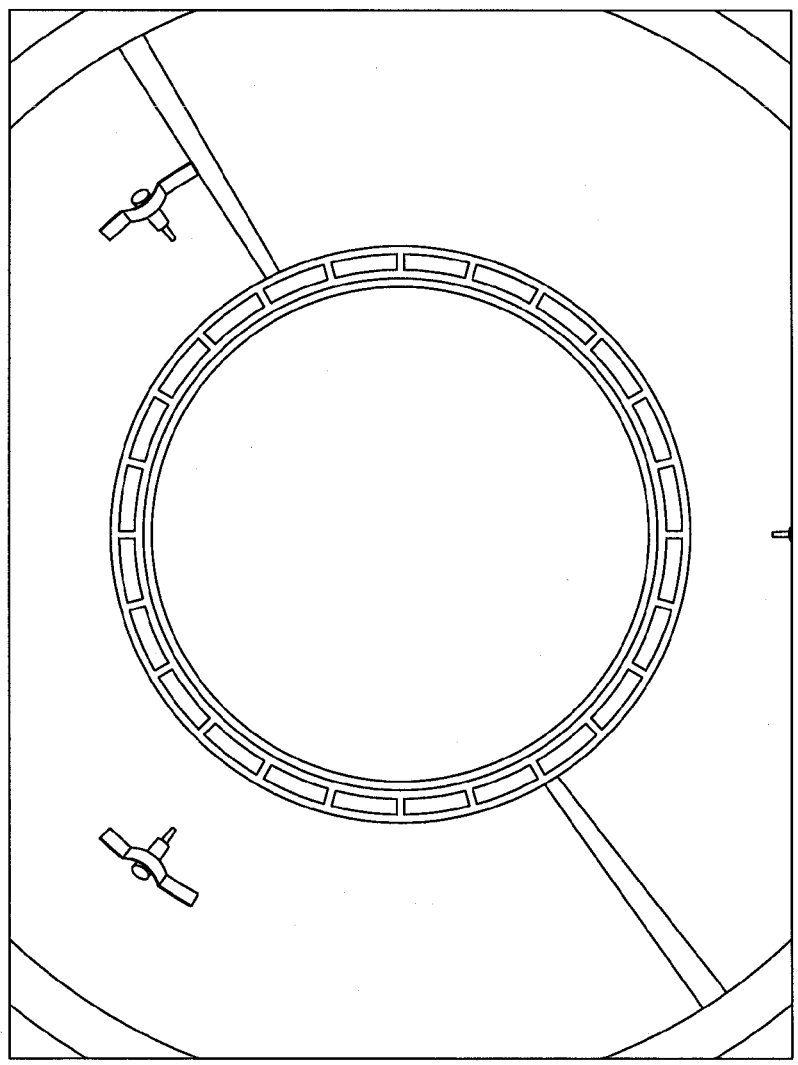
Figure 4C:
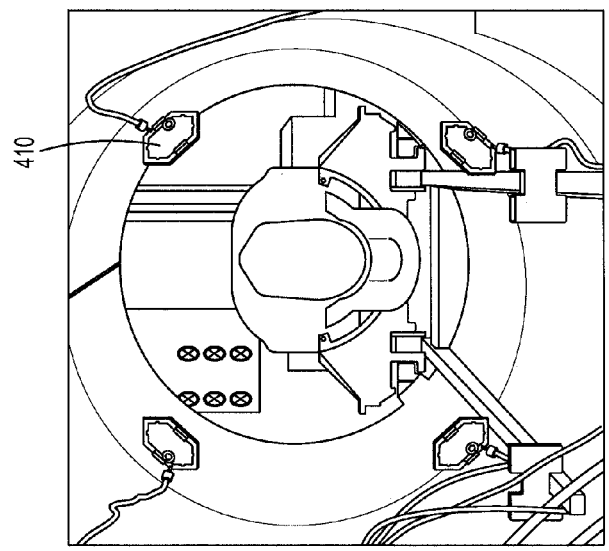
Figure 4D:
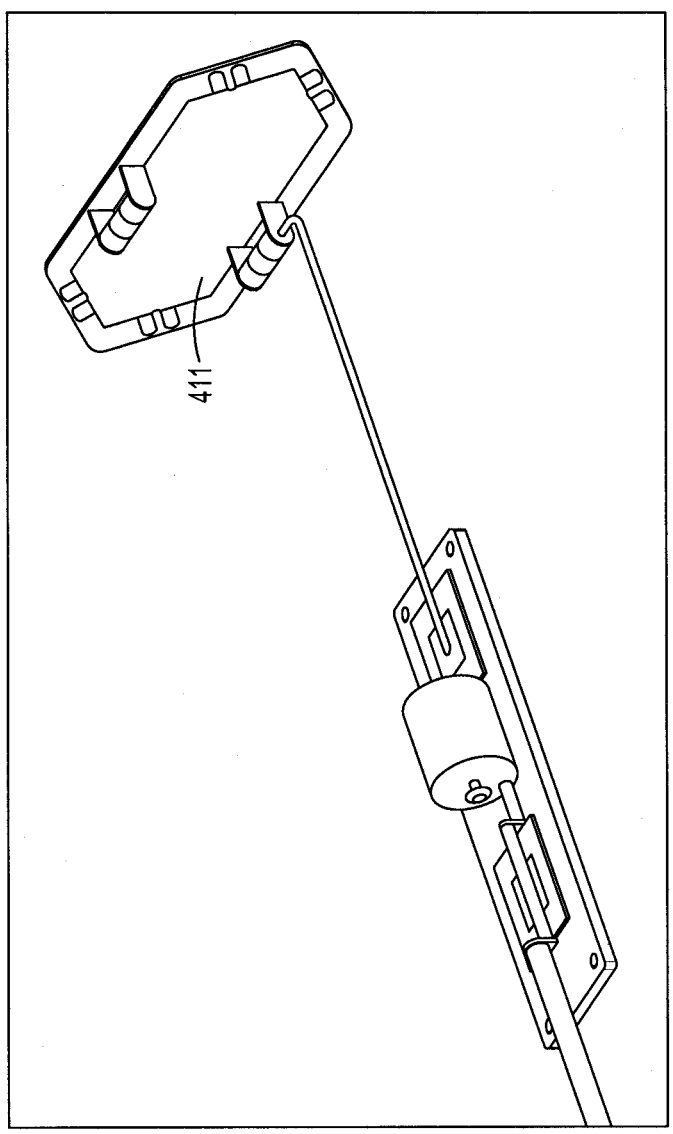

FIG. 4A shows a distal view of an exemplary Annular Ladder Resonator arrangement showing a perspective substantially aligned with the Z axis. FIG. 4B illustrates another exemplary set of Z-directed loops, e.g., 400. Exemplary loops 400 can produce, e.g., the same excitation as exemplary ALR. According to such exemplary embodiments, a number, e.g., four placements 405 can be utilized, where, e.g., 4 T/R loops can be affixed in the exemplary scanner bore tube, and driven, e.g., with a birdcage-like phase. FIG. 4C shows an exemplary illustration of the exemplary embodiment of the configuration of FIG. 4B, with affixed T/R loops 410. FIG. 4D shows an exemplary T/R loop 411, which can be the same as or similar to the loop 410.

A patch antenna excitation in accordance with certain exemplary embodiments of the present disclosure can be modeled using a resonant coil model driven in quadrature. For example, a body-sized TEM coil can be modeled based on one described by, e.g., Vaughan et al., supra., with an approximately 122 cm long RF shield of approximately 62 cm diameter centered in the warm bore. For example, 24 rungs of approximately 33 cm length and approximately 0.6 cm diameter can be arranged with their centers on a circle of approximately 58.3 cm diameter. The exemplary TEM can be tuned with exemplary capacitors in the exemplary model to create an exemplary resonant system and driven at four ports with appropriate match circuits, for example. Exemplary simulations of the three coil models (patch antenna, TEM and ALR) can be used to generate H-field vector maps, B1+ and SAR maps both for the empty bore and with the body model (e.g., approximately 5 mm×5 mm resolution). A exemplary prototype ALR coil can be provided using approximately 0.62 mm thick FR4 circuit board with dimensions that match the exemplary model. This can be placed in about 680 mm RF shield in the bench to evaluate resonant frequency, S parameters and B1+ efficiency, for example. In addition, according to certain exemplary embodiments of the present disclosure, 4 transmit receive loops of approximately 10×4.5 cm in size can be constructed and placed in the scanner bore for imaging experiments. For example, these can be connected to 4 T/R switch and preamp assemblies (e.g., Stark, Contrast, Erlangen, Germany) and driven in quadrature.

Exemplary Results

Figure 5:
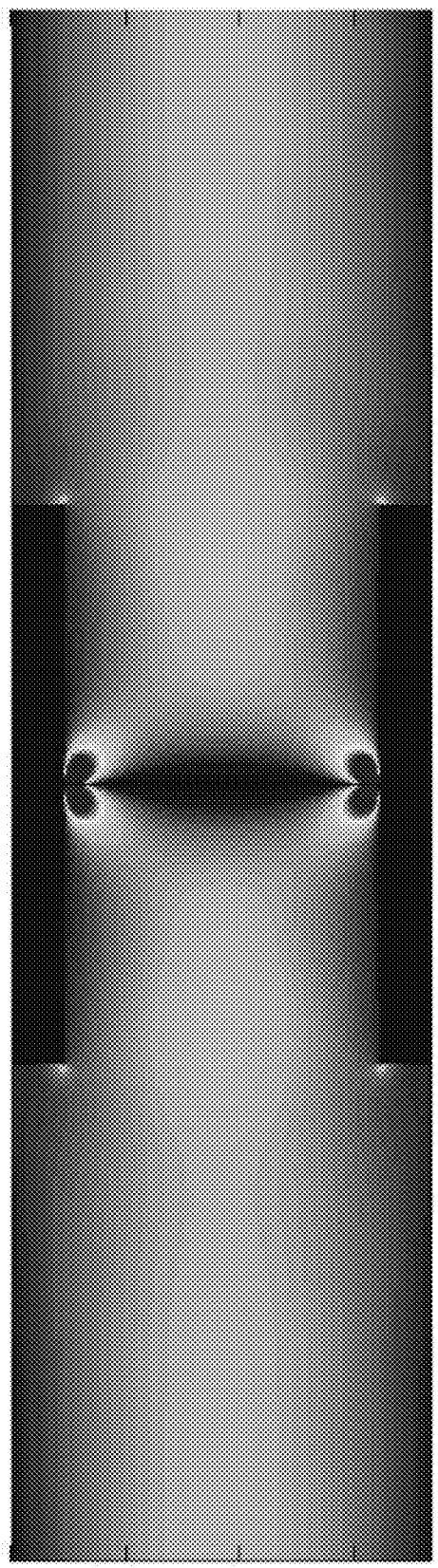
FIG. 5 is an illustration of a simulated B1+ field produced by an exemplary Annular Ladder Resonator, showing null field through the plane of the coil, in accordance with certain exemplary embodiments of the present disclosure.

In order to couple to the exemplary TE11 mode, the exemplary phase of the currents in the loops can vary directly with the azimuthal angle relative to the center of the bore, e.g., in analogy to the exemplary phase variations in the rungs of a birdcage resonating in the uniform mode. In an exemplary ALR coil resonant spectrum, the highest frequency mode can be an exemplary end ring mode, and the next mode lower down in frequency can be the exemplary desired mode corresponding to the uniform mode of a birdcage. Plots of the H-field vectors can demonstrate clearly that the exemplary TE11 mode can be being excited by the exemplary ALR coil, with waves propagating out in the + and −Z directions. FIG. 5 illustrates an exemplary simulated B1+ field produced by an exemplary ALR, showing a null field through the plane of the exemplary coil.

Figure 6:
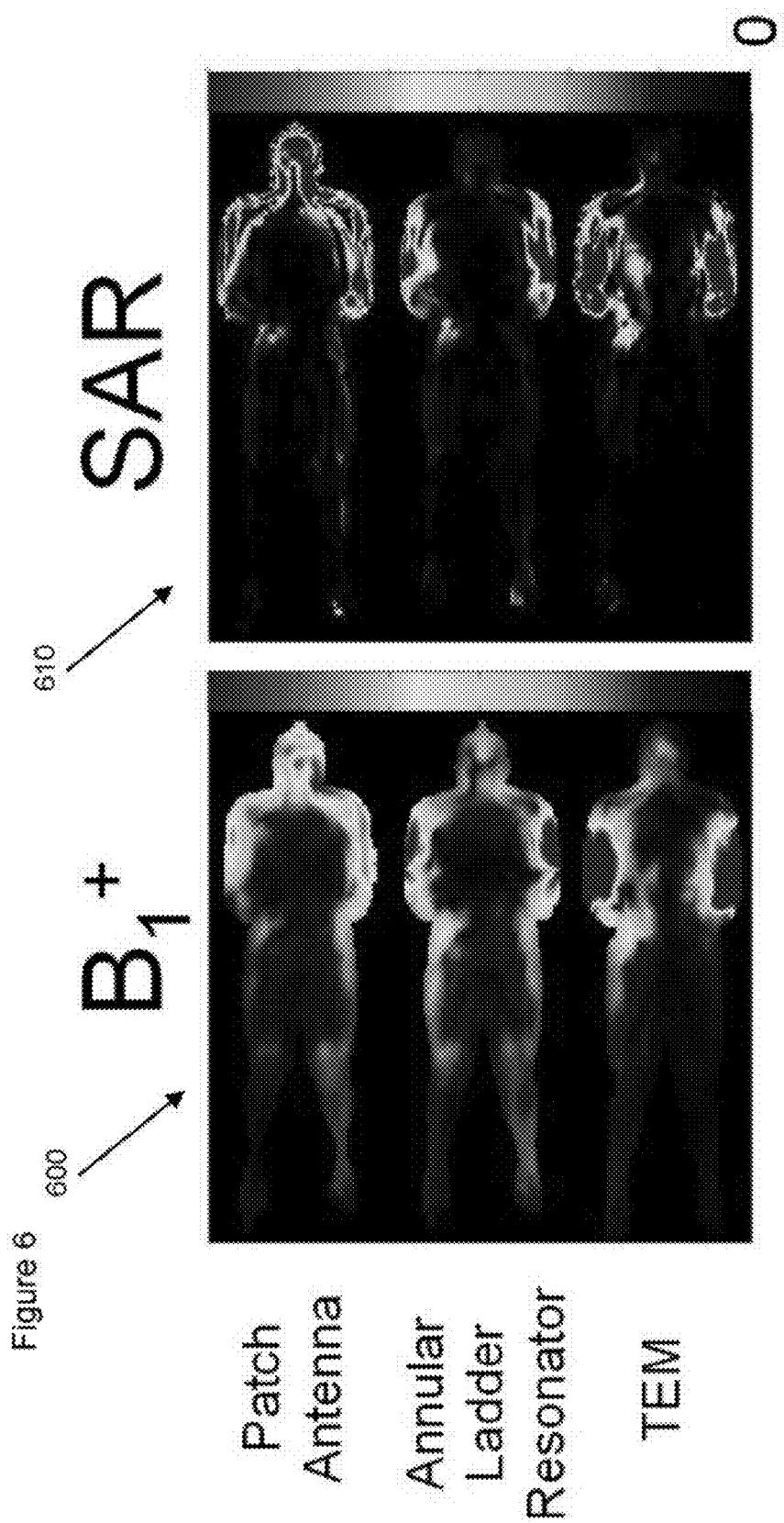
FIG. 6 is an illustration of B1+ maps and SAR maps showing SAR in the head being significantly reduced with an exemplary Annular Ladder Resonator coil compared to the patch antenna, in accordance with certain exemplary embodiments of the present disclosure.

Exemplary B1+ maps 600 for equal input power for the three coil designs and SAR maps 610 are shown in FIG. 6. The ALR coil can have a B1+ null through the plane of the exemplary coil. This can be due to exemplary symmetry constraints which can involve the exemplary B vectors being in the plane of the coil that has no radial component. Various exemplary areas immediately outside the null can have an equal and/or higher exemplary B1+ field compared to patch antenna excitation. Further, SAR in the head can be much lower with the exemplary ALR coil compared to the patch antenna (approximately 0.016 W/kg compared to approximately 0.073 W/kg). For example, an exemplary TEM coil according to the present disclosure can create the highest exemplary B1+ field in the torso of all (or essentially all) designs, though potentially with significant inhomogeneity. This can be mitigated with exemplary B1 shimming and/or accelerated parallel excitation to redistribute the exemplary B1+ field (see, e.g., Vaughan et al., supra.).

Figure 7:
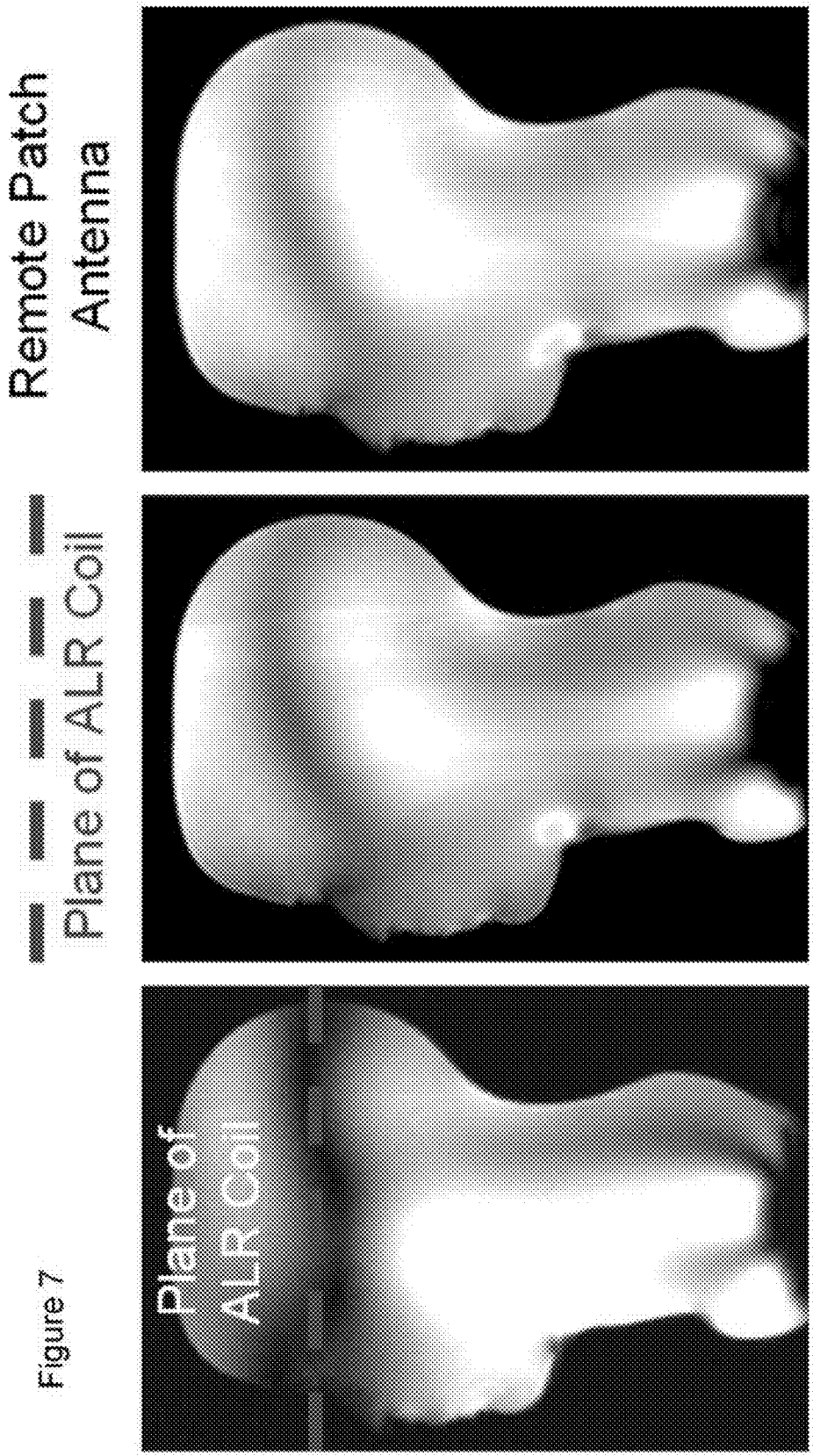
FIG. 7 is an illustration of phantom images showing exemplary ALR coil null and effect of moving the coil out of the field of vision (FoV), in accordance with certain exemplary embodiments of the present disclosure.

If the exemplary ALR coil is placed at the edge of the imaging volume (e.g., >25 cm from isocenter), it is possible that the null will not appear in the images and the excitation can still be relatively local compared to placing a patch antenna at the end of the bore, for example. FIG. 7 shows exemplary phantom images illustrating exemplary ALR coil null and an exemplary effect of moving the coil out of the field of vision (FoV). For example, four exemplary loop coils can be used to excite the exemplary TE11 mode in the exemplary scanner. It is also possible that two exemplary ALR coils can be placed in the bore on either side of isocenter, creating a standing wave between them.

Figure 8:
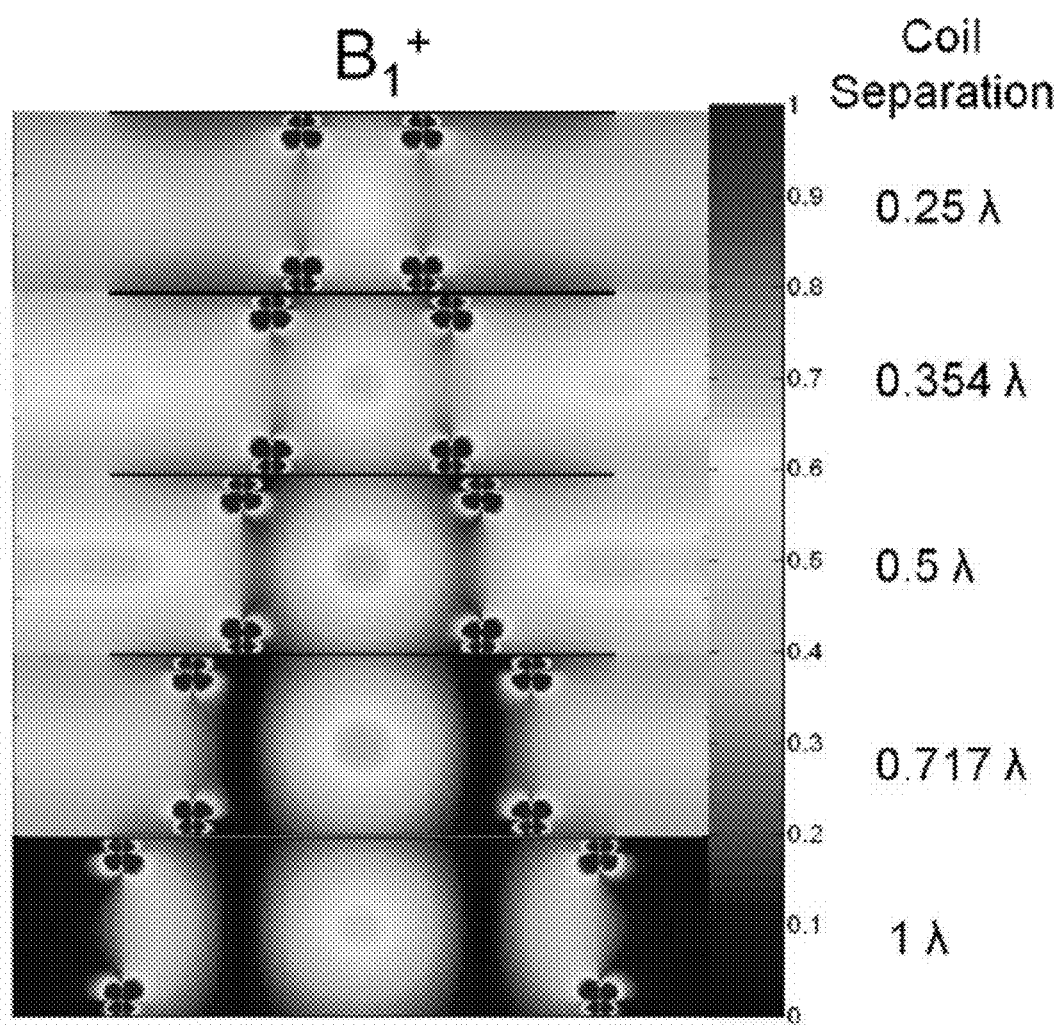
FIG. 8 is an illustration of a simulated B1+ field for a pair of exemplary ALRs with different separations between them, showing an effect of placing two exemplary ALR coils in the bore with varying distance between them, in accordance with certain exemplary embodiments of the present disclosure.

FIG. 8 shows exemplary simulated B1+ maps 800 for various separations of an exemplary double ALR coil setup with an empty bore. As shown in FIG. 8, when the two exemplary component ALRs are separated by one wavelength, it is possible that there is no propagation out of the bore. Exemplary embodiments according to the present disclosure, however, can be useful for tailoring the excitation, for example.

Figure 9A:
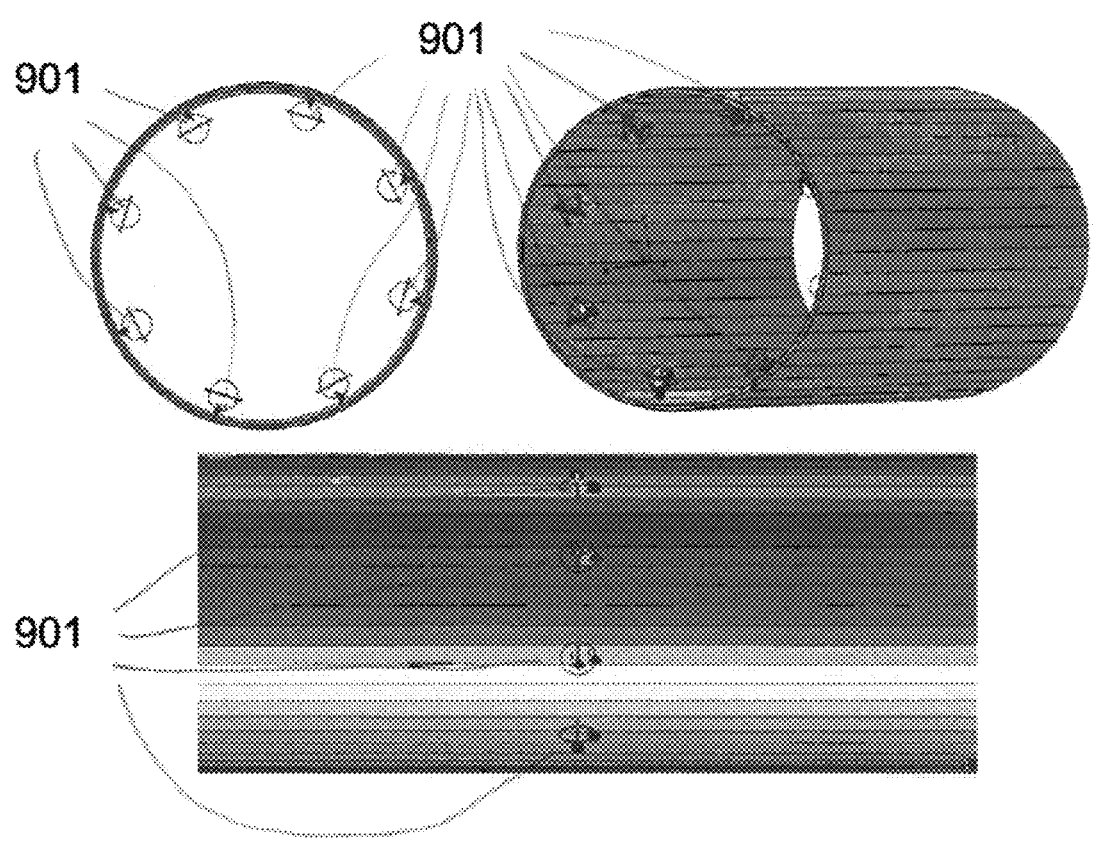
FIGS. 9A-9C are illustrations of an example of an orthogonal loop coil for TE11 mode excitation in the bore in accordance with certain exemplary embodiments of the present disclosure.
Figure 9B:
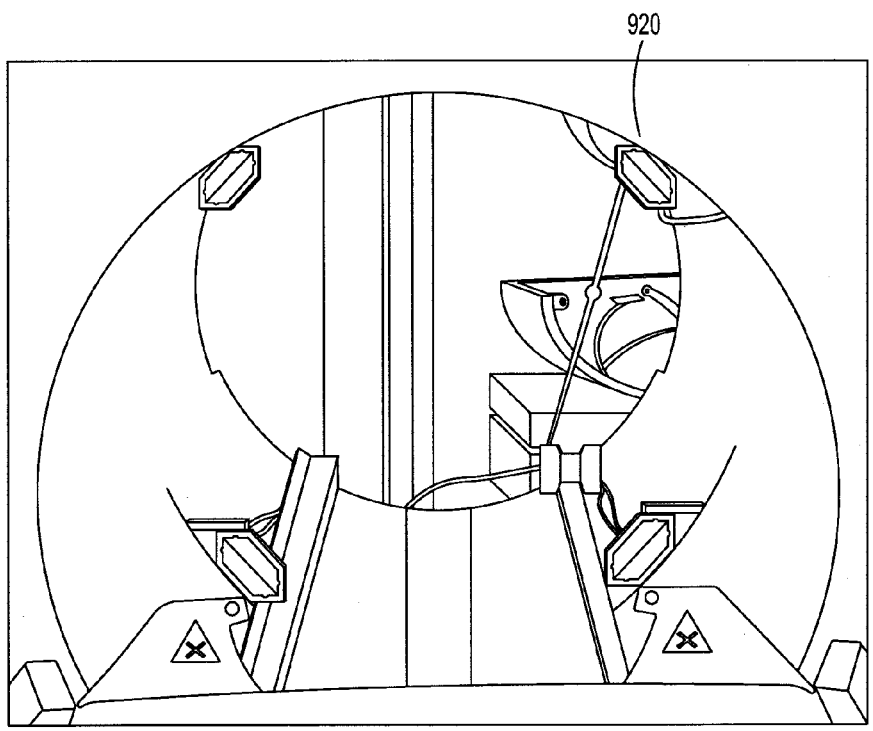
Figure 9C:
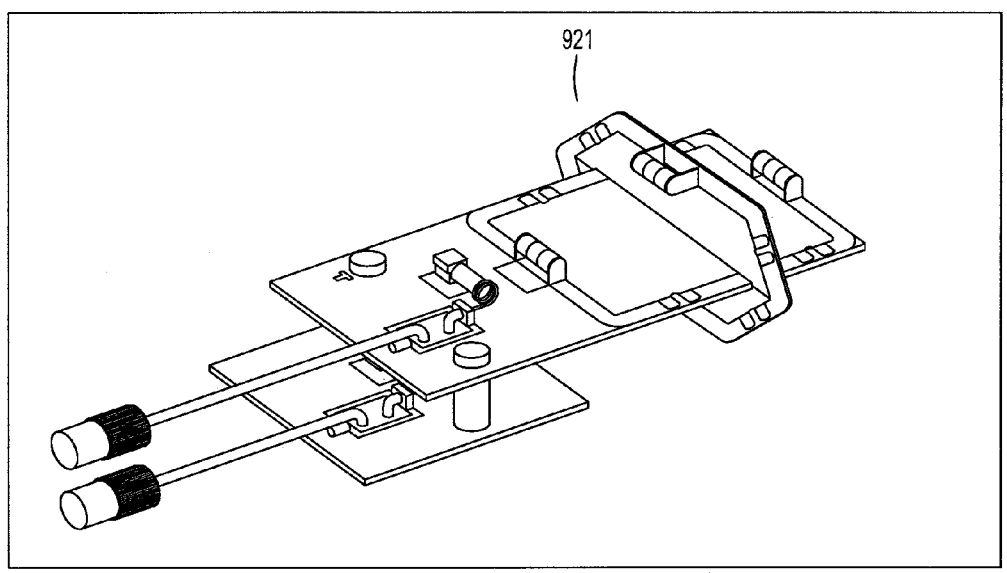

FIG. 9A shows an illustration of an exemplary usage of a 16 element orthogonal loop coil for TE11 mode excitation in the bore in accordance with certain exemplary embodiments of the present disclosure. The exemplary coil can comprise 8 pairs of loops 901, each having one oriented with its normal along Z, and the other oriented with its normal pointed towards the center of the bore. Since the two exemplary coils are likely perpendicular to each other the coupling between them can be reduced to negligible values in certain exemplary embodiments. FIG. 9B shows another exemplary usage of an 8 element orthogonal loop coil for TE11 mode excitation in the bore in accordance with certain exemplary embodiments of the present disclosure, with affixed orthogonal loop elements, e.g., 420. FIG. 9C shows an exemplary single orthogonal loop pair 921, which can be the same as or similar to the loop 920. A number of these coil pair units (for example 8 (e.g., FIG. 9B), 16 (e.g., FIG. 9A) or 32 (not shown)) can be arranged near the RF shield in an axial plane at the center of the exemplary magnet system. These exemplary loop elements, e.g., 921 and/or 920, can be shaped to fit against certain patient table rails, e.g., as shown in FIG. 9B.

Figure 10:
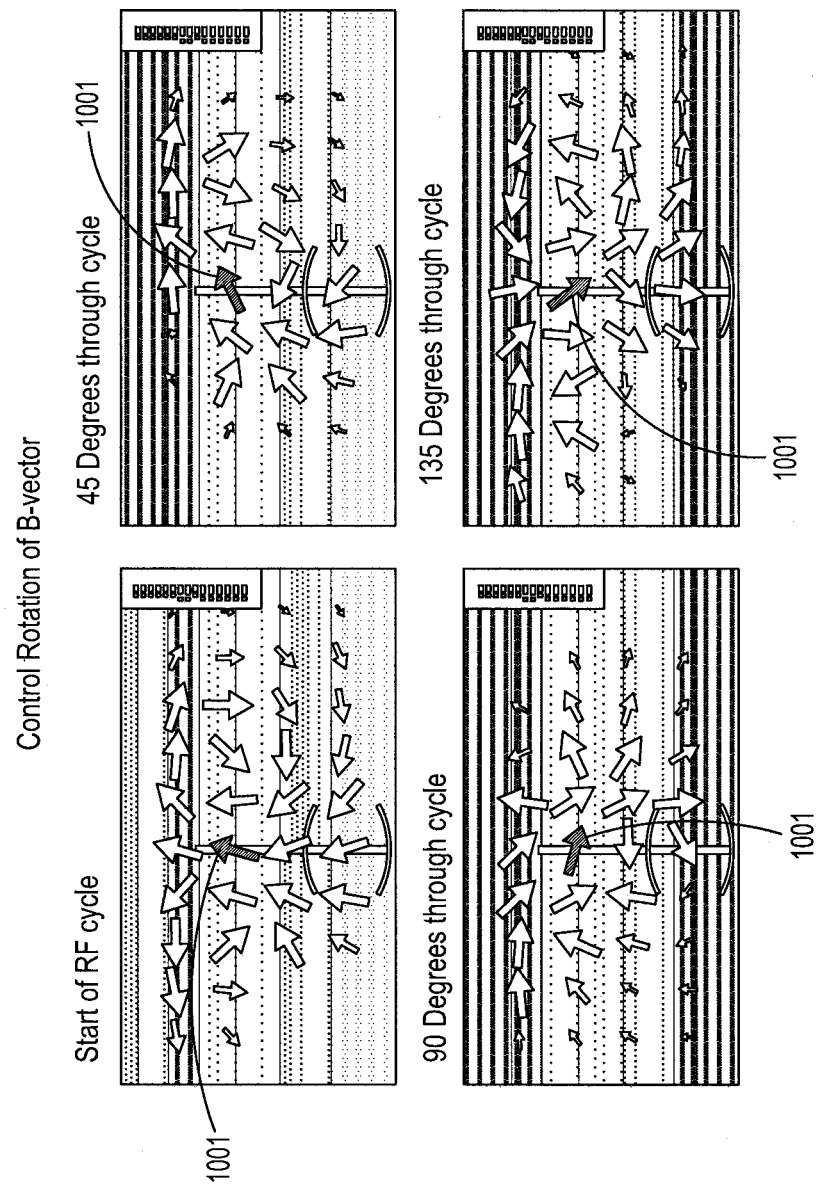
FIG. 10 is an illustration of B-vectors at different points in time curing the RF wave cycle, in accordance with certain exemplary embodiments of the present disclosure.
Figure 11:
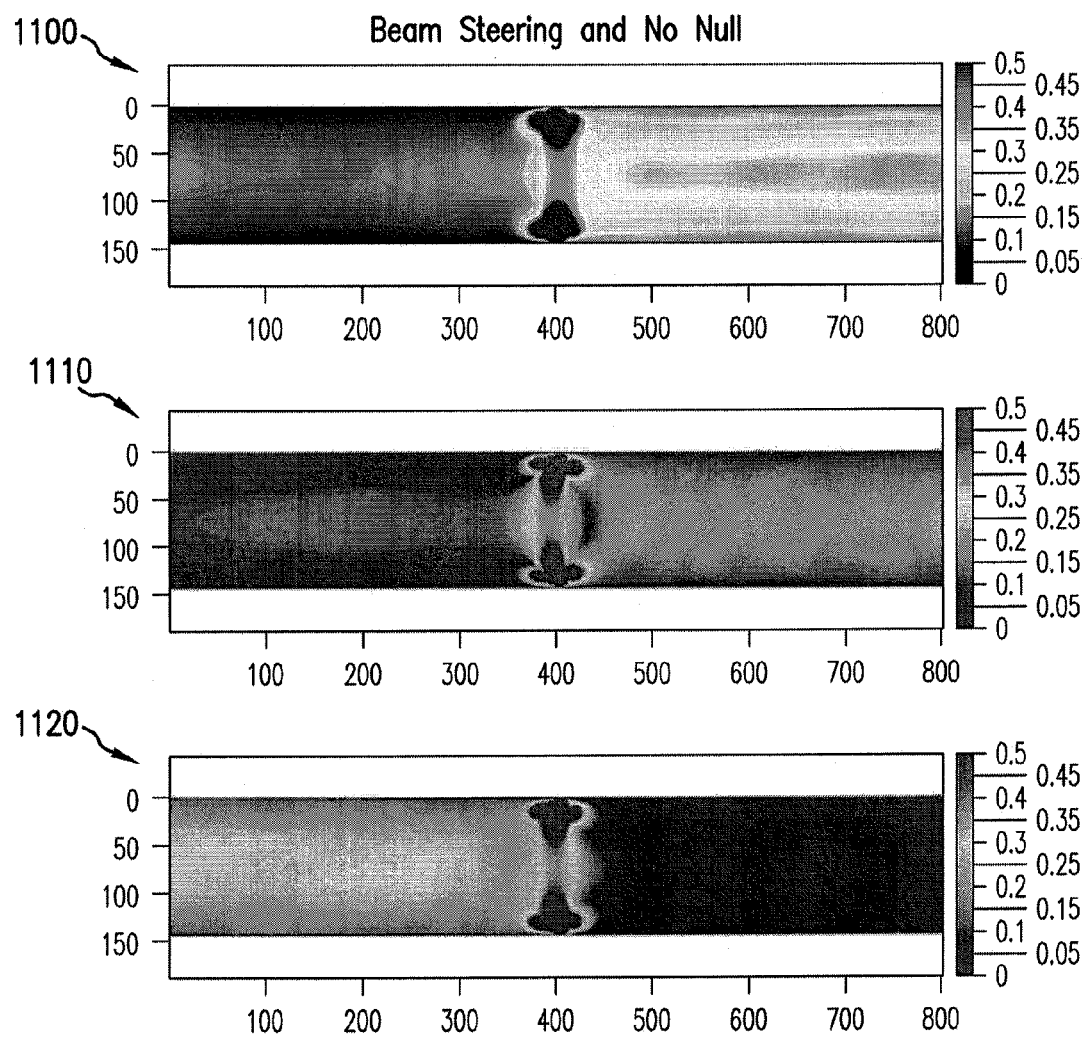
FIG. 11 are illustrations of exemplary B1+ maps for an exemplary orthogonal loops coil demonstrating exemplary beam steering, in accordance with certain exemplary embodiments of the present disclosure.

For example, FIG. 10 shows exemplary B-vectors at different points in time during the RF wave cycle. The exemplary vector highlighted with a white arrow 1001 shows that by having a 90 degree phase offset between the set of loops oriented along Z and the set of loops oriented towards the center of the bore, it can be possible to control the direction of rotation of the B vector near the periphery of the bore. This can force the TE11 mode to propagate primarily in one direction or the other, thus facilitating beam steering. FIG. 11 shows exemplary B1+ maps 1100, 1110, and 1120 for the exemplary orthogonal loops coil. For example, when the sets of loops (e.g., 2 loop) are driven with a 90 degree phase offset, the traveling wave can propagate primarily to the right, as shown in exemplary map 1100. When the phase offset is close to zero, the excitation can be primarily within the volume enclosed by the coil structure, as shown in exemplary map 1110. When the exemplary sets of loops are driven with a −90 degree phase offset, the traveling wave can propagate primarily to the left, e.g., as shown in exemplary map 1120, thus indicating the capability for exemplary beam steering.

One exemplary ALR coil can utilize about 6.8 pF in the outer ring positions and about 6.0 pF in the inner ring positions to, e.g., bring the resonant frequency to approximately 313.4 MHz. This exemplary coil can be driven at two ports, which can have S11 of about −19 and about −23 dB, respectively. The S21 coupling between the ports can be relatively high at about −7 dB, for example. The exemplary transverse B field that can be produced by the ALR coil can be about 10.7 dB lower than that produced by the patch antenna, as measured in the empty bore on the bench, for example. According to certain exemplary embodiments of the present disclosure, optimization of the tuning, symmetry and geometry of the ALR coil can be performed to achieve an acceptable and/or preferred efficiency, which can be based on the specific configuration (including configuration specifications and/or parameters) of the ALR exemplary coil, for example.

Because of the annular structure of the exemplary ALR coil according to the present disclosure, the body can pass through it, and thus it can be placed at essentially any position along the length of the bore. For example, this can allow the TE11 traveling wave mode to be excited close to the imaging volume, reducing energy deposition in more distant regions that could normally experience high power deposition with a remotely located patch antenna or crossed dipole antenna. The exemplary structure according to the present disclosure can even be situated between the gradient RF shield and the covers of the magnet, avoiding an obstruction of the bore created by the placement of a large patch antenna, for example.

FIG. 11 shows exemplary B1+ maps for the orthogonal loops coil in accordance with certain exemplary embodiments of the present disclosure. For example, when the two sets of loops are driven with a −90 degree phase offset, the traveling wave propagates primarily to the right, as shown in map 1100. When the phase offset is close to zero the excitation is primarily within the volume enclosed by the coil structure, as shown in map 1110. When the two sets of loops are driven with a −90 degree phase offset, the traveling wave propagates primarily to the left (as shown in map 1120), thus demonstrating the capability for beam steering.

Further Discussion and Exemplary Embodiments

Further, according to further exemplary embodiments according to the present disclosure the ALR for generating traveling waves in the middle of the bore can be provided (e.g., rather than beaming-in a traveling wave from one end of the bore) which can utilize certain exemplary TE11 waveguide mode(s). For example, such exemplary TE11 waveguide mode(s) can constitute the traveling wave in the bore of a whole-body 7 Tesla magnet that can have a relatively complex structure in which the magnetic field vectors are oriented primarily along the Z direction (e.g., along the axis of the bore) near the periphery of the bore.

For example, according to another exemplary embodiment according of the present disclosure, a coil arrangement can be provided that can be based on a birdcage coil design and which can be annular rather than cylindrical. The RF magnetic fields produced by the exemplary coil can be oriented primarily along Z, with the appropriate quadrature phasing around the coil, such that it can produce and/or be sensitive to the TE11 waveguide mode of the scanner bore, for example. According to certain other exemplary embodiments of the present disclosure, it is possible to utilize two ALRs in an exemplary bore which can be placed at different distances from each other so as to create an excitation between them, as well as to suppress energy escaping from the bore, e.g., as shown in FIG. 8.

In certain exemplary embodiments according to the present disclosure, the exemplary TE11 waveguide mode can be excited by using an array of loops around the periphery of the bore. For example, each exemplary loop can be oriented in the X-Y plane with the direction of its normal pointed along Z. These exemplary loops can be driven as independent transmit elements, and with the appropriate phasing of the signals sent to them an equivalent excitation to that produced by an exemplary embodiment of ALR can be obtained. One advantage of exemplary embodiments of ALR according to the present disclosure can be that it can be a resonant structure with a mode spectrum. For example, by analogy to a birdcage configuration, it is possible to drive the exemplary ALR at only two points and create a quadrature excitation of exemplary TE11 mode(s) with currents and B-fields that can be produced around the whole structure for greater efficiency.

Exemplary Beam Steering Through the Use of Orthogonal Coil Elements

To eliminate (and/or substantially eliminate, sufficiently eliminate, etc.), the null through the plane of an exemplary coil can use, e.g., orthogonal loops and/or orthogonal ladder resonators. For example, such exemplary configurations can be due to an examination of the orientation of the B-vectors near the edge of the bore as the TE11 mode "cell" propagates past a given point. This can indicate that while the B-vector can be oriented primarily along Z, it can rotate into a radial orientation as it switches from pointing in +Z to pointing in −Z. Depending on the direction of propagation of the exemplary TE11 mode, the exemplary B-vectors can rotate either clockwise or counter clockwise. Exemplary simulations of an "orthogonal loops" coil can be utilized to, e.g., explore the behavior of such a structure.

According to further exemplary embodiments of the present disclosure, a particular number (e.g., 8) loops can be provided as being oriented along Z and can be driven with a quadrature phase relationship, e.g., the phase of the RF signal sent to each coil can be equal to the azimuthal angle relative to the center of the bore. In this exemplary embodiment of 8 coils, such exemplary coils can be driven with phases of, e.g., 0, 45, 90, 135, 180, 225, 270 and 315 degrees. This can produce a B1+ field with a null through the plane of the exemplary coils, as can be with certain exemplary embodiments of ALR. For example, if the 8 exemplary loops which are oriented towards the center of the bore are also driven with a quadrature phase relationship, and with a phase offset relative to the other loop in the pair, it is possible to force the traveling wave to propagate primarily in one direction or another, and (substantially) eliminate the null through the plane of the coil, achieving beam steering.

Figure 12:
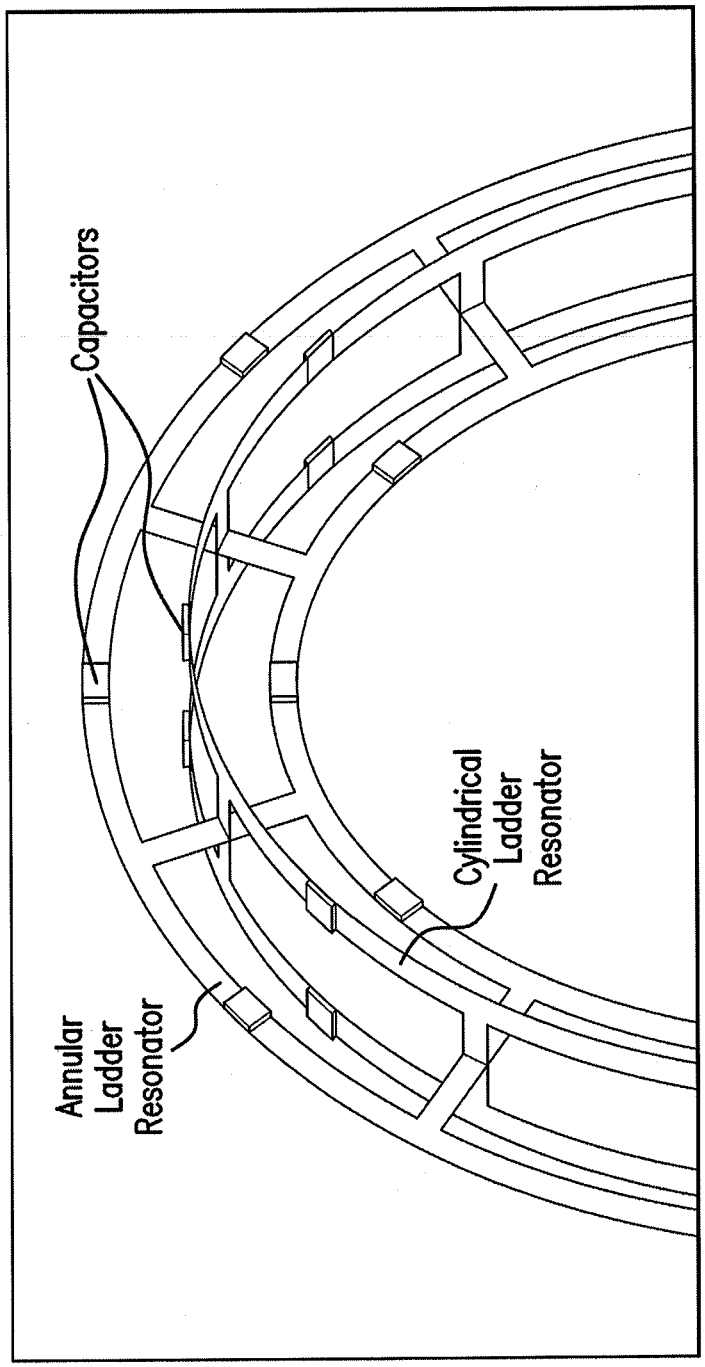
FIG. 12 is an illustration of exemplary intersecting ladder resonators that can facilitate beam steering of TE11 mode in the bore, in accordance with certain exemplary embodiments of the present disclosure.

It can also be possible to provide an exemplary intersecting set of ladder resonators. For example, one ladder resonator can be an annular ladder resonator as described herein above, for example, and the other a cylindrical ladder resonator which can essentially be a very short birdcage. With these two exemplary structures being completely (or effectively, substantially, etc.) isolated from one another due to the orthogonally of the exemplary fields they can produce, essentially or approximately the same exemplary beam steering can be possible with only 4 RF inputs (e.g., 0 and 90 degree inputs to each ladder resonator, and control of the difference in phase between the annular ladder resonator and the cylindrical ladder resonator), for example. FIG. 12 illustrates one exemplary intersecting ladder resonator that can allow beam steering of TE11 mode in the bore, for example.

Exemplary simulations according to exemplary embodiments of the present disclosure for the orthogonal loops coil can indicate how the exemplary steered beam traveling wave can behave in a human body model. Such exemplary simulations can show that the pattern of excitation can change depending on, e.g., the phase relationship between the two sets of coils. For example, this can facilitate a form of B1 shimming, where it is possible to create a B1+ field in positions in the body where there is a B1+ null by shifting the phase of the two sets of coil. It is possible to also treat the exemplary orthogonal loops coil as an exemplary transmit array with 16 elements, which can obtain a greater flexibility in the excitation pattern produced in the body.

Further, for example, according to certain exemplary embodiments of the present disclosure, it can be possible to incorporate, into the structure of transmit arrays for parallel transmit at high fields, elements whose exemplary RF field is oriented primarily along Z (which can usually be shunned because, e.g., the B1+ field which can create the exemplary MR image being oriented, e.g., entirely (substantially, significantly, or effectively, etc.) orientated in the X-Y plane). This can be beneficial for, e.g., harnessing the degrees of freedom offered by the exemplary TE11 traveling wave mode as well as more conventional near-field excitations, for example.

Figure 13A:
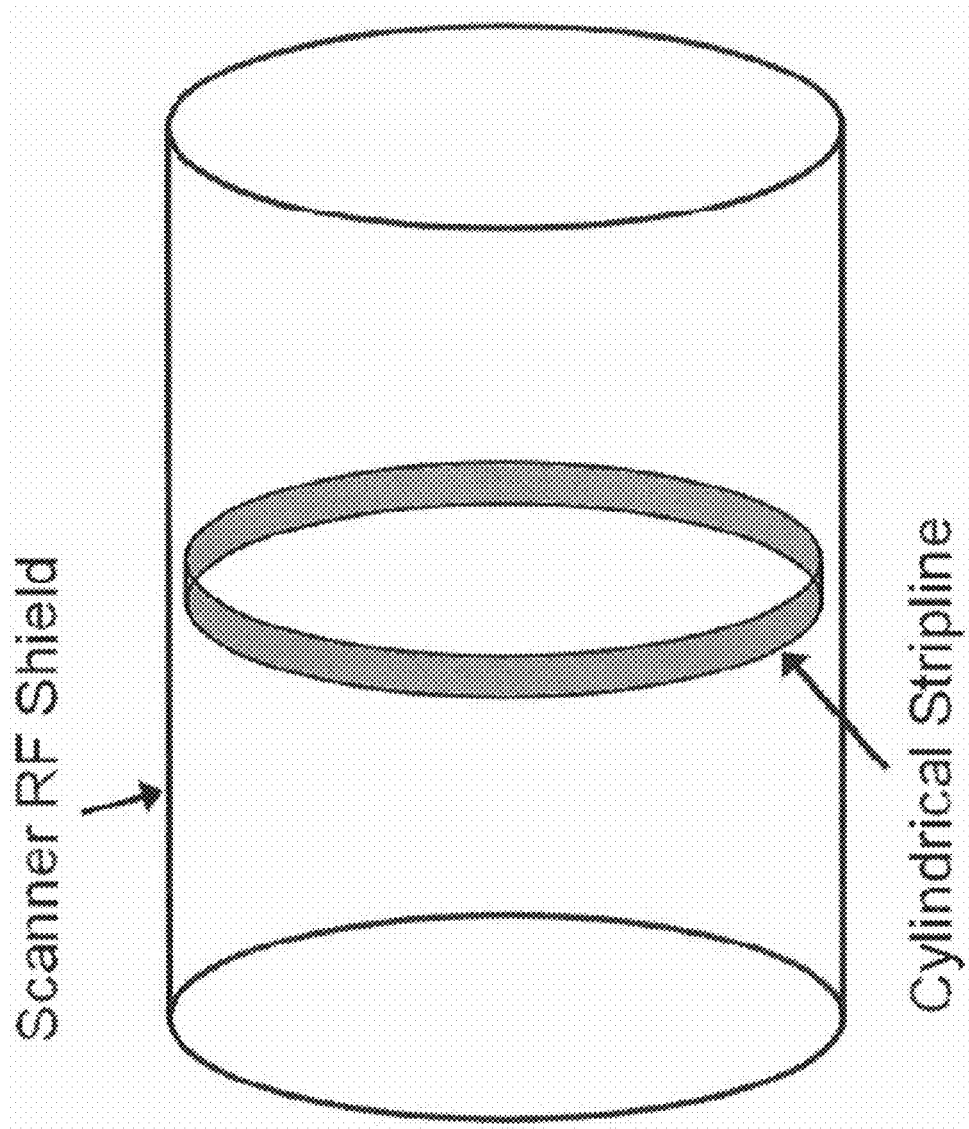
FIGS. 13(a)-13(c) are illustrations of exemplary cylindrical stripline resonators, in accordance with certain exemplary embodiments of the present disclosure.
Figure 13B:
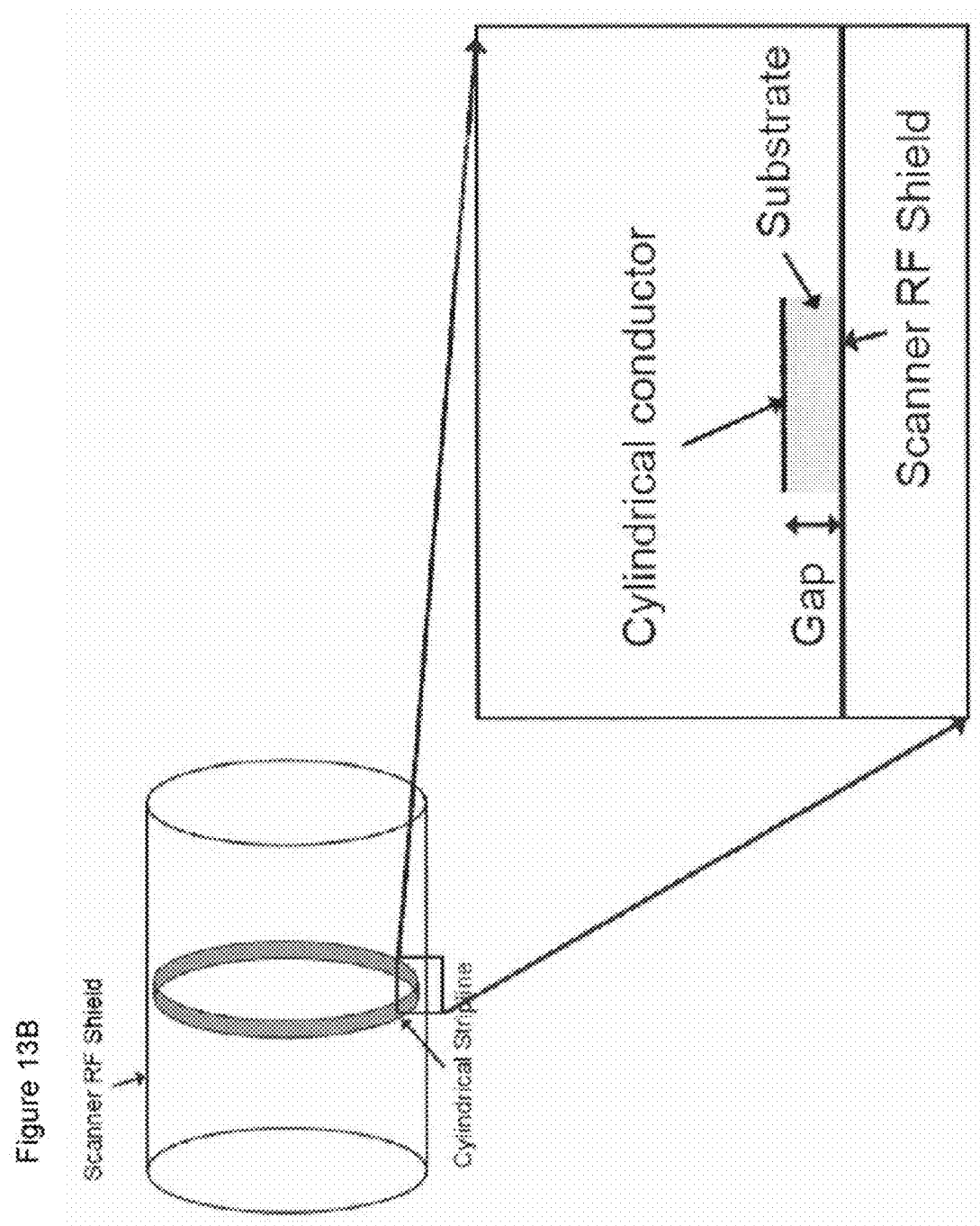
Figure 13C:
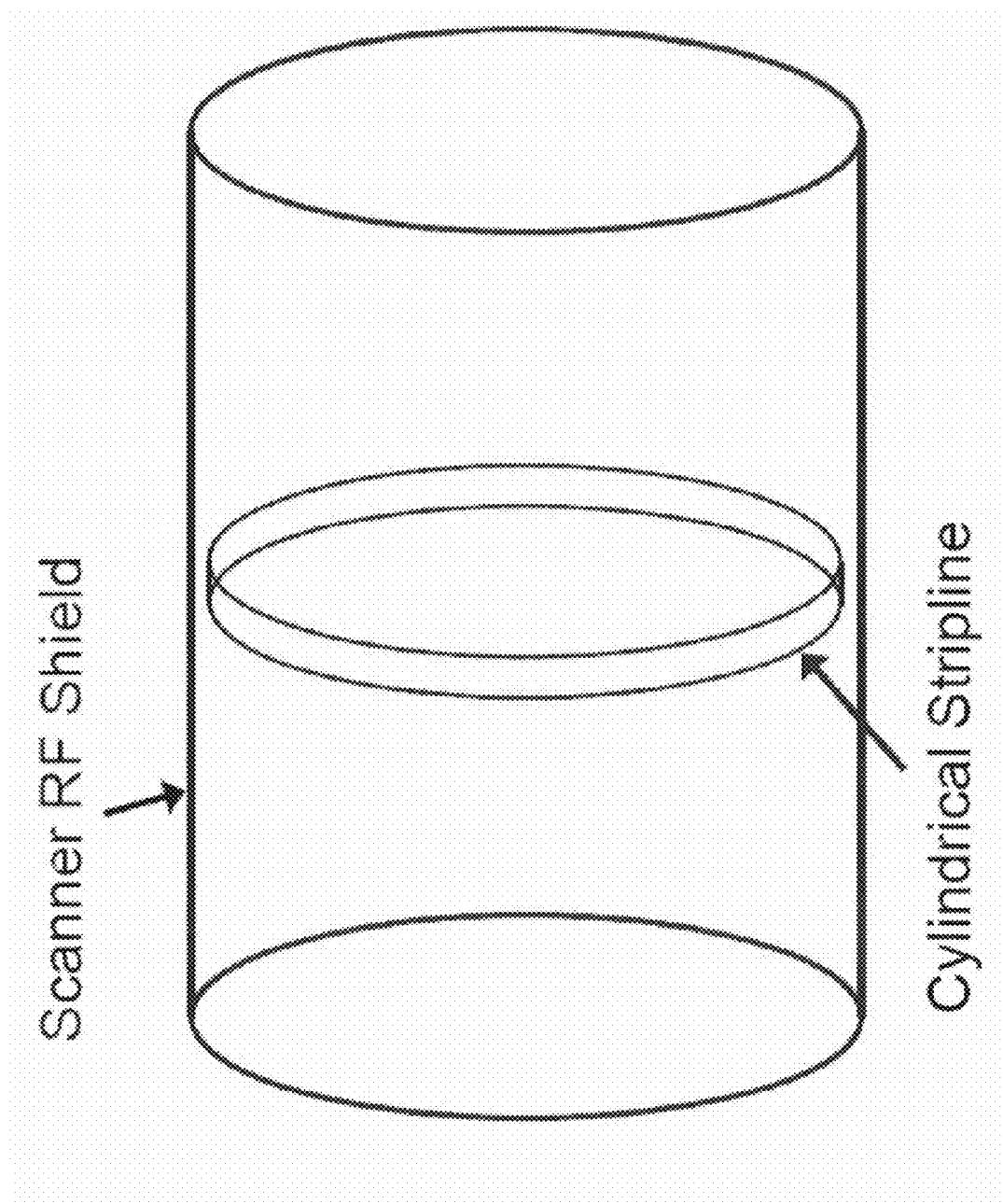

According to certain exemplary embodiments of the present disclosure, the Z-directed part could be generated by one of the encircling structures such as the cylindrical stripline coil which is illustrated in FIGS. 13(a)-13(c). An exemplary radial and/or center directed field can then be created either by, e.g., a set of loops centered on the encircling structure (e.g., to null any coupling between the structures) or a short but large diameter exemplary birdcage similarly centered relative to the encircling structure so that there can be no coupling between the two structures, for example.

Figure 14:
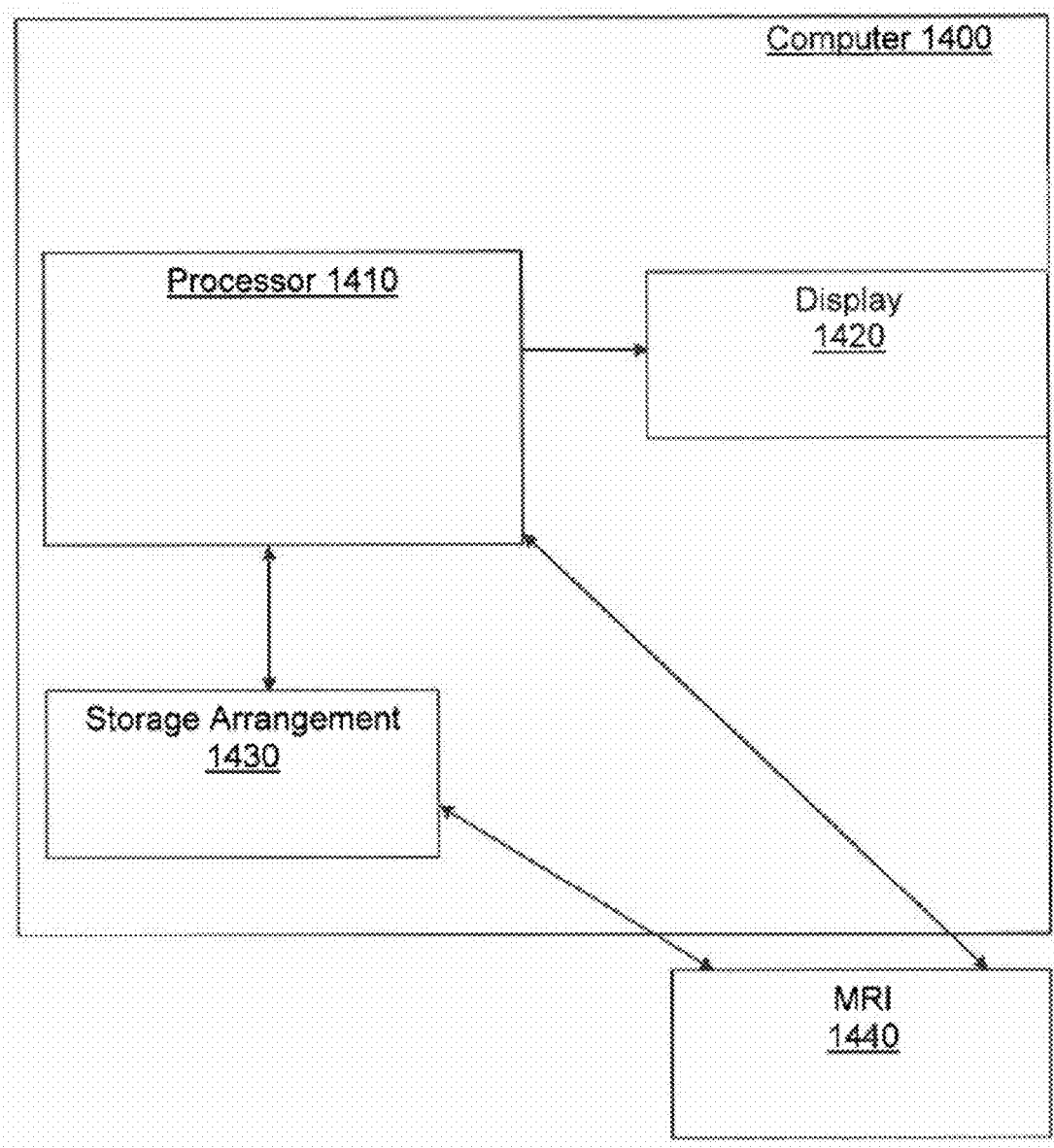
FIG. 14 is an illustration of an exemplary block diagram of an exemplary system in accordance with certain exemplary embodiments of the present disclosure.

FIG. 14 illustrates a block diagram of an exemplary embodiment of a system according to the present disclosure. A computer 1400 can be provided having a processor 1410 which can be configured or programmed to perform the exemplary steps and/or procedures of the exemplary embodiments of the techniques described above. For example, an external device, such as a system which can include an MRI component 1440, can provide measurements to the processor 1410. Such data can be associated with, for example, at least one portion of an anatomical structure. Other sensors and/or external devices or arrangements can be used to provide various type of data, e.g., external processors, biological sensors, etc. According to one exemplary embodiment of the present disclosure, the data can be stored in a storage arrangement 1430 (e.g., hard drive, memory device, such as RAM, ROM, memory stick, floppy drive, other tangible computer-accessible medium, etc.). The processor 1410 can access the storage arrangement 1430 to execute a computer program or a set of instructions (stored on or in the storage arrangement 1430) which perform the procedures according to the exemplary embodiments of the present disclosure.

Thus, e.g., when the processor 1410 performs such instructions and/or computer program, the processor can be configured to perform the exemplary embodiments of the procedures according to the present disclosure, as described above herein. For example, the processor can receive information from the MRI 1440 relating to the diffusivity of a sample. This information can be received directly from the MRI 1440 or accessed from the storage arrangement. The processor 1410 can then determine information relating to a permeability of a membrane and/or a measure of a total surface area of a membrane (or membranes) in a sample as a function of the received information.

A display 1420 can also be provided for or in the exemplary system of FIG. 14. The storage arrangement 1430 and the display 1420 can be provided within the computer 1400 or external from the computer 1400. The information received by the processor 1410 and the information determined by the processor 1410, as well as the information stored on the storage arrangement 1430 can be displayed on the display 1420 in a user-readable format.

Figure 15:
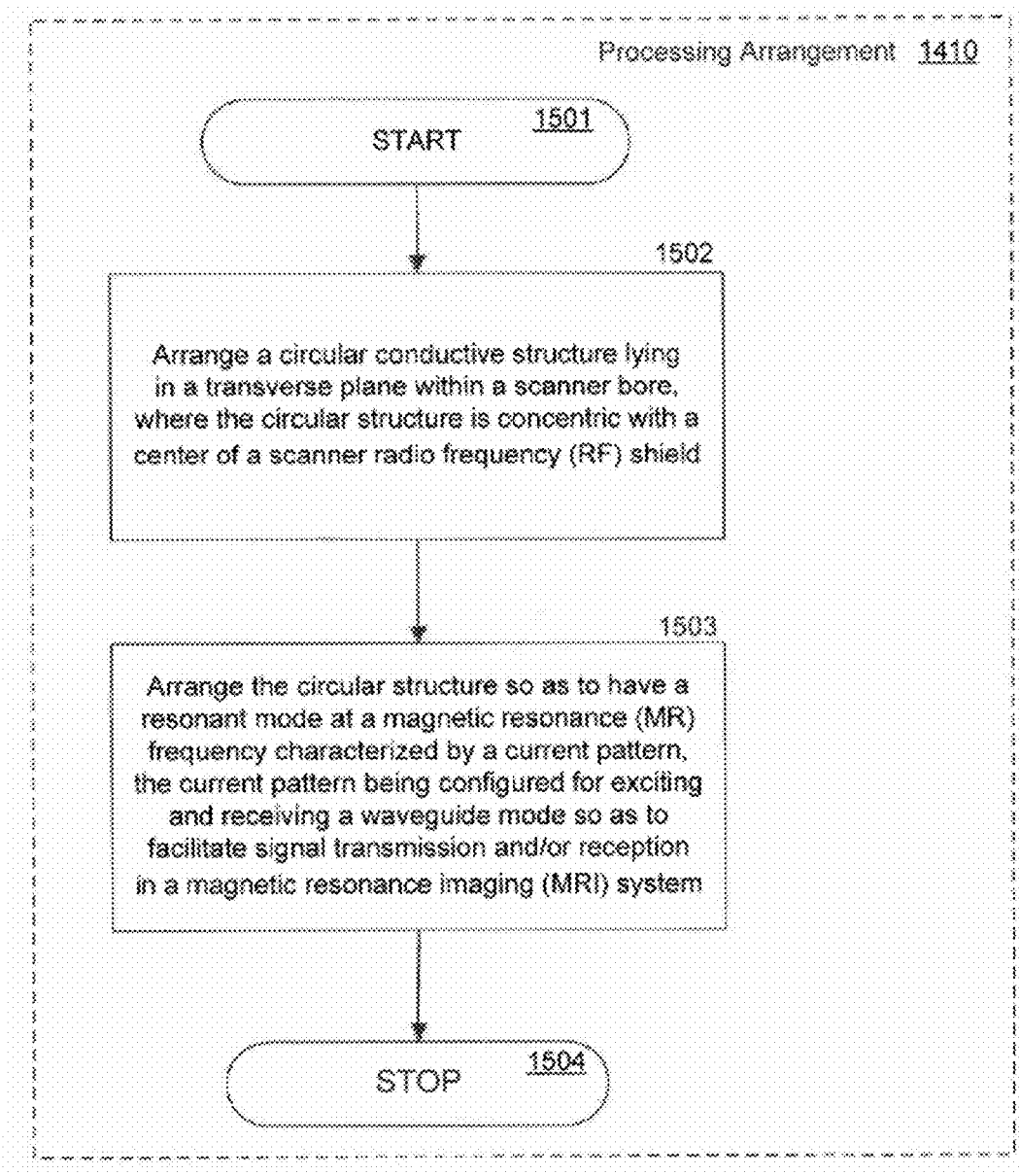
FIG. 15 is an illustration of an exemplary flow diagram of method in accordance with certain exemplary embodiments of the present disclosure.

FIG. 15 is an exemplary flow describing one exemplary embodiment of the present disclosure. The exemplary flow can be executed on an exemplary processing arrangement, such as processing arrangement 1410. The exemplary flow can begin at 1501, and at 1502 the exemplary flow can arrange a circular conductive structure lying in a transverse plane within a scanner bore, wherein the circular structure is concentric with a center of a scanner radio frequency (RF) shield. At 1503 the exemplary flow can arrange the circular structure so as to have a resonant mode at a magnetic resonance (MR) frequency characterized by a current pattern, the current pattern being configured for exciting and receiving a waveguide mode. Finally, at 1504, the exemplary flow can stop. Alternatively, exemplary flows can repeat, or execute additional and/or alternative flow steps described in other exemplary embodiments.

The foregoing merely illustrates the principles of the present disclosure. Various modifications and alterations to the described embodiments will be apparent to those having ordinary skill in art the in view of the teachings herein. It will thus be appreciated that those having ordinary skill in art will be able to devise numerous systems, arrangements, and methods which, although not explicitly shown or described herein, embody the principles of the disclosure and are thus within the spirit and scope of the disclosure. In addition, all publications and references referred to above are incorporated herein by reference in their entireties. It should be understood that the exemplary procedures described herein can be stored on any computer accessible medium, including a hard drive, RAM, ROM, removable disks, CD-ROM, memory sticks, etc., and executed by a processing arrangement which can be a microprocessor, mini, macro, mainframe, etc. In addition, to the extent that the prior art knowledge has not been explicitly incorporated by reference herein above, it is explicitly being incorporated herein in its entirety. All publications referenced above are incorporated herein by reference in their entireties.

What is claimed is:

1. A method for facilitating signal excitation and reception in a magnetic resonance system, comprising:
    arranging an electrically continuous circular conductive structure lying in a transverse plane within a scanner bore, wherein the electrically continuous circular structure is concentric with a center of a scanner radio frequency (RF) shield; and
    arranging the electrically continuous circular structure so as to have a resonant mode at a magnetic resonance (MR) frequency characterized by a current pattern, the current pattern being configured for exciting and receiving a waveguide mode,
    wherein the electrically continuous circular conductive structure includes two circular elements separated from one another and lying in the transverse plane which are connected to each other in the transverse plane at a plurality of locations.

2. The method of claim 1, wherein the current pattern is further configured to facilitate a traveling wave imaging capability.

3. The method of claim 1, further comprising positioning the structure to be located less than 5 cm from the RF shield.

4. The method of claim 1, wherein the structure has a diameter sized and configured for a facilitating at least a part of a human subject to pass through the circular structure.

5. The method of claim 1, wherein the structure is configured to facilitate a generation of an RF magnetic field to enhance a coupling to a particular waveguide mode.

6. The method of claim 5, wherein the particular waveguide mode is a TE11 waveguide mode.

7. The method of claim 5, further comprising positioning the structure at a point along a length of the scanner RF shield so as to generate a local excitation of the waveguide mode upon an excitation thereof.

8. The method of claim 7, wherein the point is a midpoint of a length of the bore.

9. The method of claim 8, further comprising positioning at least one further structure at various points along the length of the bore, and facilitating particular phase relationships between the circular structure and the at least one further structure so as to facilitate a control over the RF excitation pattern within the bore.

10. The method of claim 1, wherein the at least one resonant mode is configured to be tuned by an adjustment of a plurality of capacitors so as to facilitate a match to a MR frequency of the scanner.

11. The method of claim 1, further comprising at least one of displaying or storing at least one of (i) information associated with the MR system, or (ii) information associated with an image generated by the MR system in a storage arrangement in at least one of a user-accessible format or a non-transitory user-readable format.

12. The method of claim 1, wherein the structure further includes two further circular elements separated from one another and lying in a further plane which are connected to each other in the further plane at a further plurality of locations.

13. The method of claim 12, wherein the locations and the further locations are the same.

14. The method of claim 13, wherein the structure includes a plurality of windows, wherein each window of the windows is formed between two adjacent locations.

15. The method of claim 12, wherein the further plane is substantially perpendicular to the transverse plane.

16. The method of claim 12, wherein a combined transverse plane and further plane form an x shape.

17. A magnetic resonance coil for facilitating signal excitation and reception in a magnetic resonance system, comprising:
an electrically continuous circular conductive structure lying in an axial plane and concentric with a scanner radio frequency (RF) shield, wherein the electrically continuous circular conductive structure comprises a conductive material in at least one of a wire, a tube, a flat tape, or a ribbon shape; and
a scanner RF shield, wherein the electrically continuous circular conductive structure is located at least at or near the scanner (RF) shield, and wherein the electrically continuous circular conductive structure is a cylindrical ribbon with a constant gap between it and the scanner RF shield.

18. The coil of claim 17, wherein a width of the ribbon and a size of the gap are selected to cause the circular conductive structure to facilitate a resonant mode at the MR frequency characterized by a current pattern configured to excite and receive a waveguide mode for facilitating a traveling wave imaging procedure.

19. A magnetic resonance coil for facilitating signal excitation and reception in a magnetic resonance system, comprising:
an electrically continuous circular conductive structure lying in an axial plane and concentric with a scanner radio frequency (RF) shield, wherein the electrically continuous circular conductive structure comprises a conductive material in at least one of a wire, a tube, a flat tape, or a ribbon shape; and
a scanner RF shield,
wherein the electrically continuous circular conductive structure is closer to the scanner RF shield than it is to a central axis of the RF shield, wherein the electrically continuous circular conductive structure comprises one or more capacitors and a conductor,
wherein the one or more capacitors are arranged to be in series with the conductor so as to facilitate control of the resonant frequency of a particular mode of the structure, and
wherein the electrically continuous circular conductive structure includes two circular elements separated from one another and lying in the transverse plane which are connected to each other in the transverse plane at a plurality of locations.

20. The magnetic resonance coil of claim 19, wherein the structure further includes two further circular elements separated from one another and lying in a further plane which are connected to each other in the further plane at a further plurality of locations.

21. The magnetic resonance coil of claim 20, wherein the locations and the further locations are the same.

22. The magnetic resonance coil of claim 21, wherein the structure includes a plurality of windows, wherein each window of the windows is formed between two adjacent locations.

23. The magnetic resonance coil of claim 20, wherein the further plane is substantially perpendicular to the transverse plane.

24. The magnetic resonance coil of claim 20, wherein a combined transverse plane and further plane from an x shape.

25. A method for facilitating signal excitation and reception in a magnetic resonance system, comprising:
arranging a plurality of loop pairs, wherein each loop pair comprises orthogonal loops, wherein one loop of each loop pair lies in a transverse plane and is configured to create an RF magnetic field oriented primarily along a Z direction which extends along a direction of extension of a scanner bore, and the other loop of each loop pair is configured to create an RF magnetic field oriented primarily towards a center of the scanner bore; and
arranging the plurality of loop pairs to be positioned around a periphery of a radio frequency (RF) shield within a common transverse plane, wherein each of the loops which create an RF magnetic field oriented primarily along the Z direction are driven so as to facilitate a phase of a current in each driven loop to vary based on the azimuthal angle relative to the center of the scanner bore.

26. The method of claim 25, wherein the Z direction extends along a direction of a main static magnetic field.

27. A method for facilitating signal excitation and reception in a magnetic resonance system, comprising:
arranging an electrically continuous circular conductive structure lying in a transverse plane within a scanner bore, wherein the electrically continuous circular structure is concentric with a center of a scanner radio frequency (RF) shield;
arranging the electrically continuous circular structure (i) so as to have a resonant mode at a magnetic resonance (MR) frequency characterized by a current pattern, the current pattern being configured for exciting and receiving a waveguide mode and (ii) at a point along a length of the scanner RF shield, which is at a midpoint of the length of the bore, so as to generate a local excitation of the waveguide mode upon an excitation thereof; and
positioning at least one further structure at various points along the length of the bore, and facilitating particular phase relationships between the electrically continuous circular structure and the at least one further structure so as to facilitate a control over the RF excitation pattern within the bore;
wherein the electrically continuous circular structure is configured to facilitate a generation of an RF magnetic field to enhance a coupling to a particular waveguide mode.

28. A method for facilitating signal excitation and reception in a magnetic resonance system, comprising:
- arranging an electrically continuous circular conductive structure lying in a transverse plane within a scanner bore, wherein the electrically continuous circular structure is concentric with a center of a scanner radio frequency (RF) shield; and
- arranging the electrically continuous circular structure so as to have a resonant mode at a magnetic resonance (MR) frequency characterized by a current pattern, the current pattern being configured for exciting and receiving a waveguide mode;
- wherein the electrically continuous circular conductive structure includes two circular elements separated from one another, and wherein a distance between the two circular elements is less than a radius of each of the two circular elements.

* * * * *